United States Patent [19]
Forbes et al.

[11] Patent Number: 6,141,238
[45] Date of Patent: Oct. 31, 2000

[54] DYNAMIC RANDOM ACCESS MEMORY (DRAM) CELLS WITH REPRESSED FERROELECTRIC MEMORY METHODS OF READING SAME, AND APPARATUSES INCLUDING SAME

[75] Inventors: Leonard Forbes, Corvallis, Oreg.; Kie Y. Ahn, Chappaqua, N.Y.; Wendell P. Noble, Milton, Vt.; Alan R. Reinberg, Westport, Conn.

[73] Assignee: Micron Technology, Inc., Boise, Id.

[21] Appl. No.: 09/385,380

[22] Filed: Aug. 30, 1999

[51] Int. Cl.⁷ ...................................................... G11C 11/22
[52] U.S. Cl. ............................................ 365/145; 365/149
[58] Field of Search ....................................... 365/145, 149

[56] References Cited

U.S. PATENT DOCUMENTS

| | | | |
|---|---|---|---|
| 4,888,733 | 12/1989 | Mobley | 365/145 |
| 5,345,415 | 9/1994 | Nakao et al. | 365/145 |
| 5,399,516 | 3/1995 | Bergendahl et al. | 438/589 |
| 5,497,494 | 3/1996 | Combs et al. | 395/750.05 |
| 5,530,668 | 6/1996 | Chern et al. | 365/145 |
| 5,539,279 | 7/1996 | Takeuchi et al. | 365/145 |
| 5,541,871 | 7/1996 | Nishimura et al. | 365/145 |
| 5,541,872 | 7/1996 | Lowery et al. | 365/145 |
| 5,550,770 | 8/1996 | Kuroda | 365/145 |
| 5,572,459 | 11/1996 | Wilson et al. | 365/145 |
| 5,600,587 | 2/1997 | Koike | 365/145 |
| 5,603,011 | 2/1997 | Piazza | 711/170 |
| 5,619,642 | 4/1997 | Nielson et al. | 395/182.04 |
| 5,640,030 | 6/1997 | Kenney | 257/296 |
| 5,689,456 | 11/1997 | Kobayashi | 365/145 |
| 5,768,185 | 6/1998 | Nakamura et al. | 365/145 |
| 5,856,688 | 1/1999 | Lee et al. | 257/295 |
| 5,903,492 | 5/1999 | Takashima | 365/145 |

OTHER PUBLICATIONS

Takashima et al.; "A sub–40ns Random–Access Chain FRAM Architecture with a 7ns Cell–Plate–Line Drive"; IEEE International Solid–State Circuits Conference, 1999, pp. 102, 103 and 450.

Miyakawa et al.; "A 0.5 $\mu$m 3V 1T1C 1 Mb FRAM with a Variable Reference Bitline Voltage Scheme using a Fatigue-Free Reference Capacitor"; IEEE International Solid–State Circuit Conference, 1999, pp. 104, 105 and 450.

Asari et al; "Multi–Mode and Multi–Level Technologies for FeRAM Embedded Reconfigurable Hardware"; IEEE International Solid–State Circuits Conference, 1999, pp. 106, 107 and 451.

(List continued on next page.)

*Primary Examiner*—Trong Phan
*Attorney, Agent, or Firm*—Dickstein Shapiro Morin & Oshinsky LLP

[57] ABSTRACT

A memory cell having first and second operating modes includes a transistor comprising a gate adjacent to a channel region coupling source and drain regions, a digitline coupled to one of the source and drain regions, a storage capacitor coupled to the other of the source and drain regions, a ferroelectric capacitor, and a wordline coupled to the gate by the ferroelectric capacitor. Preferably, data is written to and read out of the storage capacitor during the first operating mode and written to and read out of the ferroelectric capacitor during the second mode of operation. A memory cell array, a memory module, and a processor based system can all be fabricated from this memory cell. A method for reading data out of the memory cell in first and second operating modes is also described.

61 Claims, 14 Drawing Sheets

OTHER PUBLICATIONS

Kang et al.; "Multi–Phase–Driven Split–Word–Line Ferroelectric Memory without Plate Line", IEEE International Solid–State Circuits Conference, 1999, pp. 108–109.

Cuppens et al.; "Ferroelectrics for non–volatile memories", Microelectronic Engineering 19, (1992), pp. 245–252.

Arita et al.; "Characterization of Ferroelectric Gate MOS Capacitors Formed by MOD Technique for Nonvolatile Memory Applications"; Integrated Ferroelectrics, 1998 vol. 2, pp. 143–152.

Torii et al.; "Properties of ultra–thin lead zirconate titanate thin films prepared by ozone jet reactive evaporation"; J. Appl. Phys. vol. 81, No. 6, Mar. 1997, pp. 2755–2759.

Tuttle et al; "Ferroelectric Thin Films IV"; Material Research Society Symposium Proceedings, vol. 361, 1994, pp. 249–254.

Amanuma et al.; "Preparation and Ferroelectric properties of $SrBi_2Ta_2O_9$ thin films"; Appl Phys. Lett vol. 66, No. 2, Jan. 1995, pp. 221–223.

Onishi et al.; "A Half–Micron Ferroelectric Memory Cell Technology with Stacked Capacitor Structure"; IEEE 1994, pp. 843–846.

Sheikholeslami; "Transient modeling of Ferroelectric Capacitors for Semiconductor Memories"; Thesis, University of Toronto; 1994; pp. 1–66.

Tanabe et al.; "A High Density 1T/2C Cell with Vcc/2 Reference Level for high Stable FeRAMs"; IEEE 1997, pp. 863–866.

Kokie et al.; "A 60–ns 1–Mb Nonvolatile Ferroelectric Memory with a Nondriven Cell Plate Line Write/Read Scheme"; IEEE Journal of Solid–State Circuits; vol. 31, No. 11, Nov. 1996, pp. 1625–1634.

Tuttle et al; "Ferroelectric Thin Films IV"; Material Research Society Symposium Proceedings, vol. 361, 1994, pp. 409–414.

Koike et al.; "A 60–ns 1–Mb Nonvolatile Ferroelectric Memory with a Non–driven Cell Plate Line Write/Read Scheme"; IEEE International Solid–State Circuits Conference, 1996, pp. 368–369.

Ramer et al.; "Ferrolelectric Capacitor Nondestructive Readout Memory"; Integrated Ferroelectircs 1995 vol. 11, pp. 171–177.

Fujisawa et al.; "The Charge–Share Modified (CSM) Precharge–Level Architecture for High–Speed and Low–Power Ferroelectric Memory"; IEEE Journal of Solid–State Circuits, vol. 32, No. 5, May 1997, pp. 655–661.

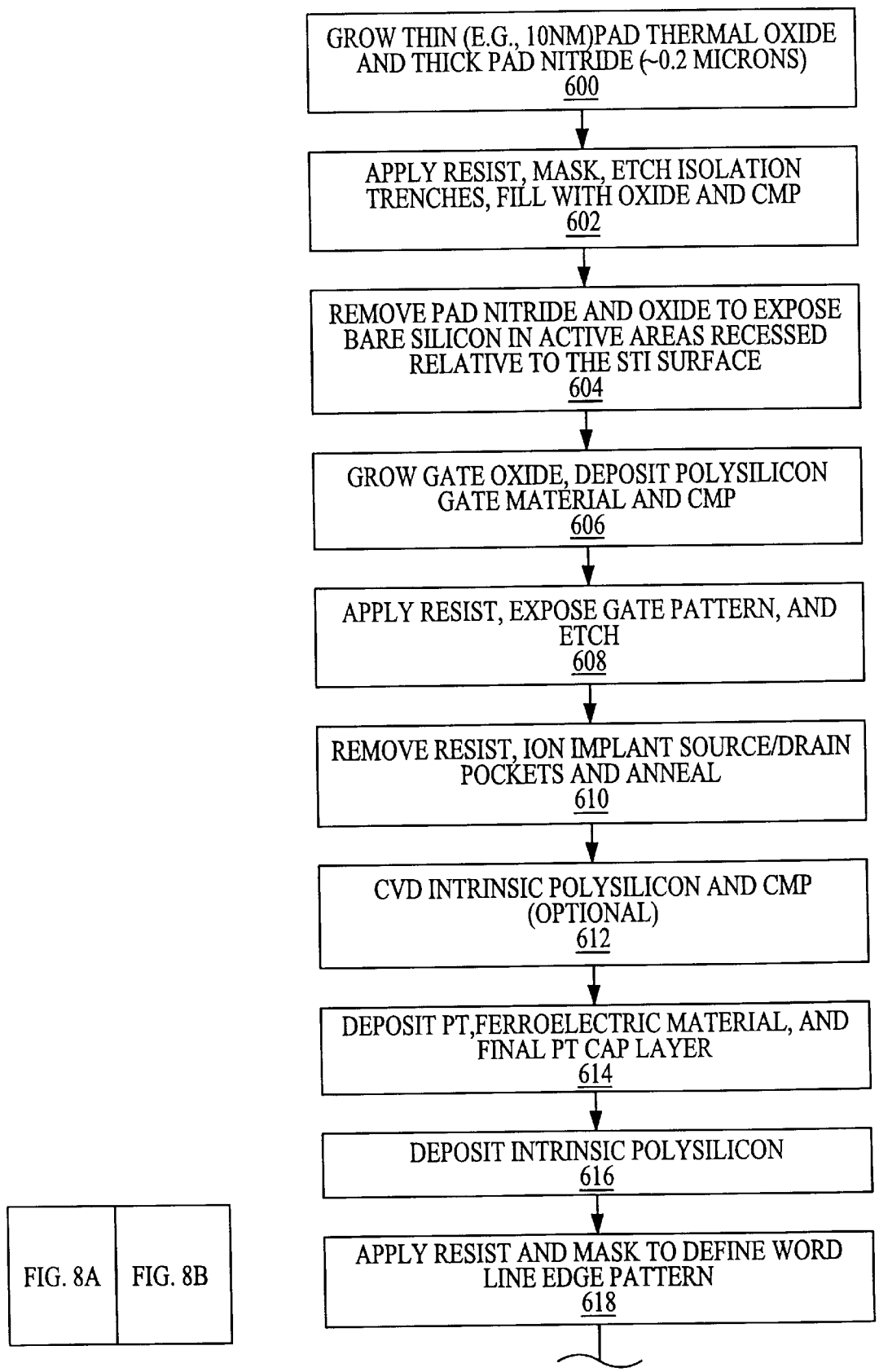
FIG. 8 | FIG. 8A

DYNAMIC RANDOM ACCESS MEMORY (DRAM) CELLS WITH REPRESSED FERROELECTRIC MEMORY METHODS OF READING SAME, AND APPARATUSES INCLUDING SAME

BACKGROUND OF THE INVENTION

1. Field of the Invention

The present invention relates to dynamic random access memory (DRAM) devices. More specifically, the present invention relates to DRAM cells with repressed ferroelectric memory. Methods for reading such DRAM cells and memory arrays and systems containing DRAM cells with repressed ferroelectric memory are also disclosed.

2. Description of Related Art

Dynamic random access memories (DRAMs) are the most cost-effective, high-speed memory used with present day computers. DRAMS last nearly indefinitely. Moreover, DRAMs are available in very high density configurations, e.g., 64 megabytes (MB). However, DRAMS can only store information for a limited time without constant refreshing and lose all knowledge of their state once power is removed.

Ferroelectric capacitors are currently being used as nonvolatile memory devices, as disclosed in U.S. Pat. No. 4,888,733, which is entitled "Non-volatile Memory Cell and Sensing Method" and discloses a two transistor, one capacitor (2T/1C) memory cell. In addition, ferroelectric capacitors are often employed in nonvolatile random access memories (NVRAMs). Memory cells having structures approximating that of DRAMs, i.e., arranged in the conventional one transistor, one capacitor (1T/1C) memory cell pattern, are disclosed in U.S. Pat. No. 5,600,587 (Ferroelectric Random Access Memory), U.S. Pat. No. 5,572,459 (Voltage Reference for a Ferroelectric 1T/1C Based Memory), U.S. Pat. No. 5,550,770 (Semiconductor Memory Device Having FE Capacitor Memory Cells with Reading, Writing, and Forced Refreshing Functions and a Method of Operating the Same), U.S. Pat. No. 5,530,668 (Ferroelectric Memory Sensing Scheme Using Bit Lines Precharged to a Logic One Voltage), and U.S. Pat. No. 5,541,872 (Folded Bit Line Ferroelectric Memory Device). It should be mentioned that all of the patents cited above are incorporated by reference herein for all purposes.

In the above-mentioned patents, the capacitor in a 1T/1C DRAM structure is replaced by a ferroelectric capacitor, as illustrated in FIG. 1(a). The memory cell 1 of FIG. 1(a) includes a wordline 10, a digitline 12, a transistor 14 and a ferroelectric capacitor 16. In operation, the remnant charges are detected on a bit line in a manner similar to the operation of a conventional DRAM.

There is an extensive body of literature on both the electrical characteristics of ferroelectric capacitors and their applications in cells similar to conventional DRAMs, except that these cells are classified as nonvolatile RAMs (NVRAMs) instead of DRAMs. One recent publication by K. Asaril et al., entitled "Multi-Level Technologies for FRAM Embedded Reconfigurable Hardware" (IEEE Int. Solid-State Circuits Conf., San Francisco 1999, pp. 108–109), describes the use of a ferroelectric capacitor in a ferroelectric RAM (FRAM) which is employed with low voltage to store and access RAM data superimposed on less-frequently accessed read-only memory (ROM) data in the same cell. See U.S. Pat. No. 5,539,279, entitled "Ferroelectric Memory." The RAM data is volatile and needs to be refreshed on a regular basis, or this aspect of the cell acts like a DRAM. The electrically alterable read-only memory (EAROM), e.g., an electrically erasable programmable ROM (EEPROM) data is nonvolatile. In other words, the FRAM acts like a DRAM with a "repressed" nonvolatile read only "memory," or "repressed memory."

Other applications use the ferroelectric capacitors as part of a stacked gate structure similar not to DRAMs but rather to EEPROM or flash memory devices. See, for example, U.S. Pat. No. 5,541,871 ("Nonvolatile Ferroelectric Semiconductor Memory") and U.S. Pat. No. 5,856,688 ("Integrated Circuit Memory Devices Having Nonvolatile Single Transistor Unit Cells Therein"), which patents are also incorporated herein by reference for all purposes. It will be appreciated that in these devices, however, the remnant charge or polarization charge of the ferroelectric element is used to store information rather than electrons injected onto or removed from a floating gate by hot electron effects and/or tunneling. Instead, the charge differences are not differences in the number of electrons trapped on the gate but rather the polarization charge of the upper ferroelectric capacitor.

The simplest possible memory cell structure is shown in FIG. 1(b) where a ferroelectric is used as the gate insulator of a transistor. Ads shown in FIG. 1(b), a memory cell 1' includes a wordline 10, a digitline 12, a transistor 14, and a ferroelectric capacitor 20, one plate of the ferroelectric capacitor forming the gate of the transistor 14. The problem with this basic structure is that the placement of ferroelectric material directly on the silicon substrate results in a high surface state density precluding effective transistor operation.

It should also be mentioned that the prior art referenced in U.S. Pat. No. 5,541,871 describes a basic structure consisting of a ferroelectric capacitor in series with a gate capacitance, which are both planar structures. See FIG. 1(c) wherein the memory cell 1", includes the wordline 10, digitline 12, transistor 14, a low dielectric oxide capacitor 30 and a ferroelectric capacitor 32. It will be noted that the capacitor 30 forms the normal oxide gate of the transistor 14. The problem with this disclosed structure is that the ferroelectric elements have very high electric permittivities as, for instance, 80 and 150. It will be appreciated that these permittivity values are 20 to 40 times higher than that of silicon dioxide. It will also be appreciated that, if comparable thicknesses of materials as are used in constructing the ferroelectric and conventional oxide capacitors, only a small fraction, e.g., 2% to 5%, of the voltage applied across the series capacitors will appear across the ferroelectric capacitor. Thus, if the ferroelectric capacitor has a coercive voltage, Vc, i.e., the voltage required for programming, of 1 volt or 3 volts, then the total word line voltage required for programming the memory cell will be on the order 20V to 150V. It will be noted that this is far in excess of voltages used on current CMOS-integrated circuits.

U.S. Pat. No. 5,541,871 seeks to solve this problem by providing an external contact, 31, to the metal plate between the ferroelectric material and the gate oxide material. This allows programming of the ferroelectric with a lower voltage.

U.S. Pat. No. 5,856,688 seeks to solve this problem by using a "C" shaped floating gate and two control gates. One control gate is a plate of the ferroelectric capacitor and the other control gate is a plate of another capacitor fabricated using a high dielectric constant material. The two capacitors in series, one with a high dielectric constant ferroelectric and the other with a high dielectric constant insulator, are used to program the ferroelectric capacitor at lower voltages.

Since the capacitances are more or less comparable, the programming voltage will divide more equally, resulting in a significant fraction across the ferroelectric capacitor. As shown in FIG. 1(d) the memory cell 1''', consists of a wordline, 10 a digitline 12, a transistor, 14, a gate oxide capacitor, 40, a ferroelectric capacitor, 42, a high dielectric constant capacitor, 44, and address line, 11.

It would be very desirable if a memory cell or device could be developed with all of die positive features of DRAMS, i.e., cost, size, speed, availability, etc., which also is nonvolatile, i.e., maintains its memory state with power removed. It would be highly desirable to have a memory element and corresponding system that functions just like today's DRAM and which, in addition to their normal function, i.e., storing information as charge on the capacitor, also has some form of nonvolatile but very low level information storage mechanism. It will be appreciated that a memory device and corresponding system with these characteristics would be desirable, even if both types of data, i.e., volatile and non-volatile data, could not be accessed at a single, relatively high speed.

SUMMARY OF THE MENTION

In one aspect, the present invention provides a one transistor/two capacitor (1T/2C) memory cell having first and second modes of operation for storing first and second data types. According to one aspect of the inventive memory cell, the first mode of operation is a dynamic mode of operation and the second mode of operation is a repressed memory mode of operation. According to another aspect of the invention, one of the two capacitors comprises a ferroelectric capacitor.

In another aspect, the present invention provides a memory cell having first and second operating modes, including a transistor comprising a gate adjacent to a channel region coupling source and drain regions, a digitline coupled to one of the source and drain regions, a storage capacitor coupled to the other of the source and drain regions, a ferroelectric capacitor, and a wordline coupled to the gate by the ferroelectric capacitor. Preferably, data is written to and read out of the storage capacitor during the first operating mode and written to and read out of the ferroelectric capacitor during the second mode of operation.

In yet another aspect, the present invention provides a memory cell storing first and second data types. Preferably, the memory cell includes a transistor comprising a gate opposing a channel region coupling source and drain regions, a digitline coupled to one of the source and drain regions, a storage capacitor, which stores the first type of data, coupled to the other of the source and drain regions, a ferroelectric capacitor, which stores the second type of data, and a wordline coupled to the gate by the ferroelectric capacitor. The first type of data can be transient data while the second type of data can be permanent data.

In still another aspect, the present invention provides a one transistor/two capacitor (1T/1C) memory cell array, wherein each of the 1T/1C memory cells has first and second modes of operation, the first mode of operation accessing a first memory plane and the second operating mode accessing a second memory plane. Preferably, the first mode of operation is a dynamic mode of operation while the second mode of operation is a repressed memory mode of operation. In an exemplary case, the memory cell array includes N memory cells and, thus, each of the first and second memory planes stores N bits of data. According to one specific aspect of the present invention, the first and second operating modes have respective first and second data writing voltages, the first data writing voltage being a predetermined percentage of the second data writing voltage.

In another aspect, the present invention provides a memory cell array storing first and second data types in first and second data storage planes, respectively, including a plurality of memory cells organized as an array of rows and columns, and a sense amplifier coupled to the digitline of the memory cells. Preferably all, but at least one of the memory cells, includes a transistor comprising a gate opposing a channel region coupling source and drain regions, a digitline coupled to one of the source and drain regions, a storage capacitor, which stores the first type of data, coupled to the other of the source and drain regions, a ferroelectric capacitor, which stores the second type of data, and a wordline coupled to the gate by the ferroelectric capacitor. Advantageously, the first data storage plane stores volatile data while the second data storage plane stores non-volatile data. The data is written into the first data storage plane when the wordline or the respective memory cell is at a first potential and data is written to the second data storage plane when the wordline is at a second potential higher than the first potential but below the maximum operating voltage of the transistor.

In a still further aspect, the present invention provides a processor-based system, including a processor, and a memory cell array storing first and second data types in first and second data storage planes, respectively. Preferably, the memory cell array includes multiple memory cells organized as an array of rows and columns, at least one of the memory cells including a transistor comprising a gate opposing a channel region coupling source and drain regions, a digitline coupled to one of the source and drain regions, a storage capacitor, which stores the first type of data, coupled to the other of the source and drain regions, a ferroelectric capacitor, which stores the second type of data, and a wordline coupled to the gate by the ferroelectric capacitor, and a sense amplifier coupled to the digitline of the at least one memory cell. Preferably, the first data storage plane of the memory cell array stores volatile data while the second data storage plane of the memory cell array stores non-volatile data.

In still another aspect, the present invention provides a memory module, including a substrate comprising a circuit board, a plurality of memory chips mounted on the substrate, wherein one or more of the memory chips comprise a memory cell array fabricated on the semiconductor chip communicating with a processor. Preferably, the memory cell array includes a plurality one transistor/two capacitor (1T/2C) memory cells, each of the 1T/1C memory cells having first and second modes of operation, the first mode of operation accessing a first memory plane and the second operating mode accessing a second memory plane.

In yet another aspect, the present invention provides a method for reading information from a one transistor/two capacitor (1T/2C) memory cell having first and second modes of operation. Preferably the method includes steps for reading a first data value from a first of the two capacitors in the first mode of operation, and reading a second data value derived from a state of a second of the two capacitors. According to one aspect of the inventive method, the transistor includes a control gate, and the step of reading the first data value from the first capacitor in the first mode of operation includes substeps for applying a voltage in excess of a threshold voltage of the transistor to the control gate, and sensing a potential of a charge stored in the first capacitor. Moreover, the step of reading the second data value derived from a state of the second capacitor includes substeps for applying a voltage approximately equal to the threshold voltage of the transistor to the control gate, and sensing a response time of the transistor.

BRIEF DESCRIPTION OF THE DRAWINGS

These and various other features and aspects of the present invention will be readily understood with reference to the following detailed description taken in conjunction with the accompanying drawings, in which like or similar numbers are used throughout, and in which.

DETAILED DESCRIPTION OF THE PREFERRED EMBODIMENTS

Illustrative embodiments and exemplary applications will now be described with reference to the accompanying drawings which disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1A:
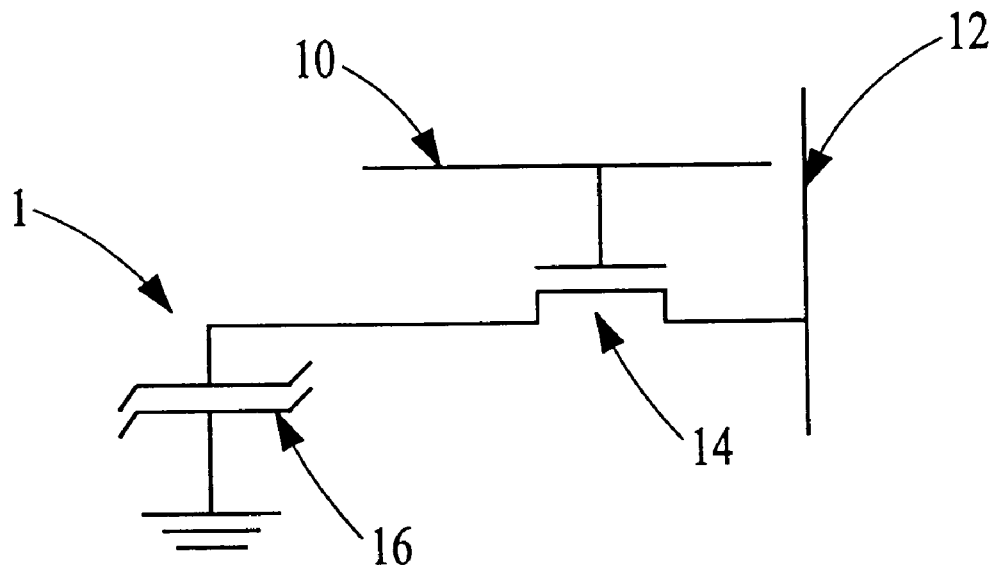
FIG. 1(a) illustrates a first use of a ferroelectric capacitor in a conventional memory cell.
Figure 1B:
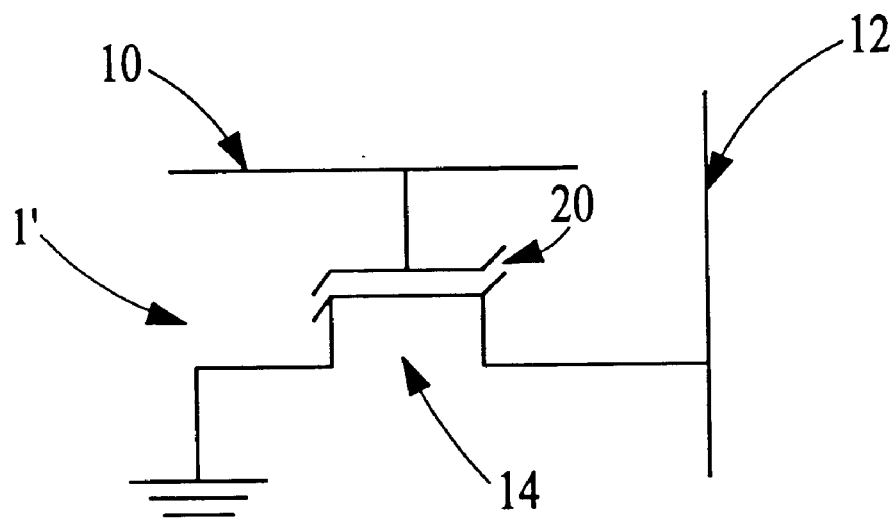
FIG. 1(b) illustrates a second use of a ferroelectric capacitor in a conventional memory cell.
Figure 1C:
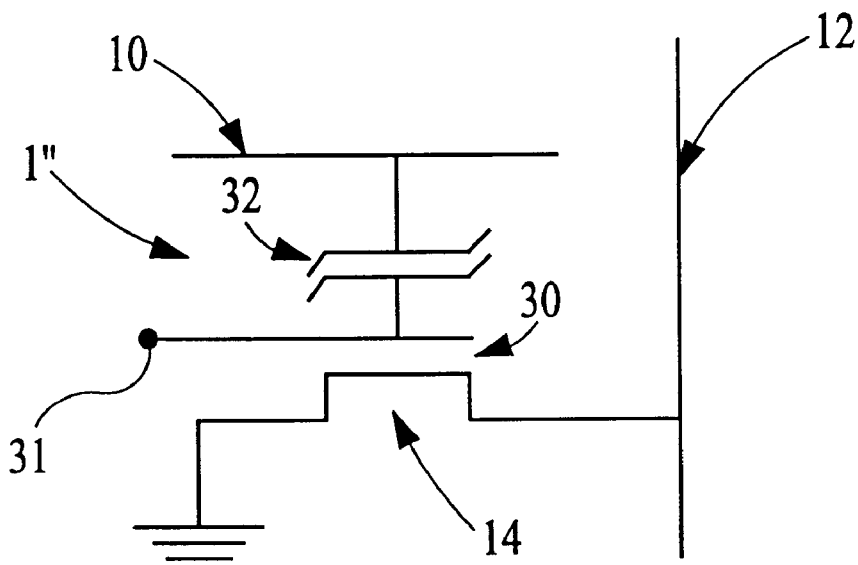
FIG. 1(c) illustrates a third use of a ferroelectric capacitor in a conventional memory cell.
Figure 1D:
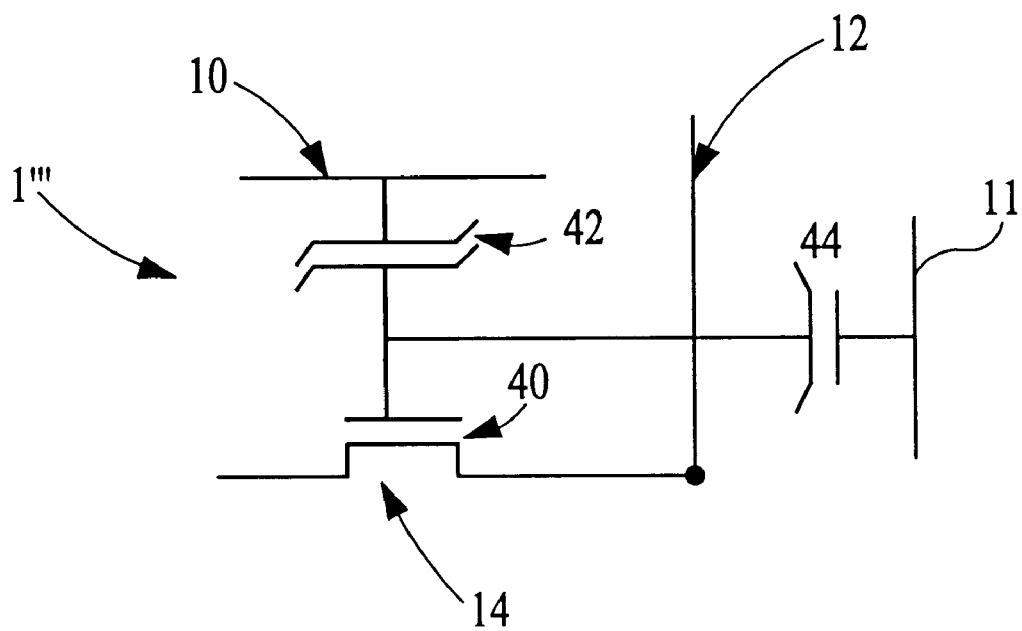
FIG. 1(d) illustrates a fourth use of a ferroelectric capacitor in a conventional memory cell.
Figure 2:
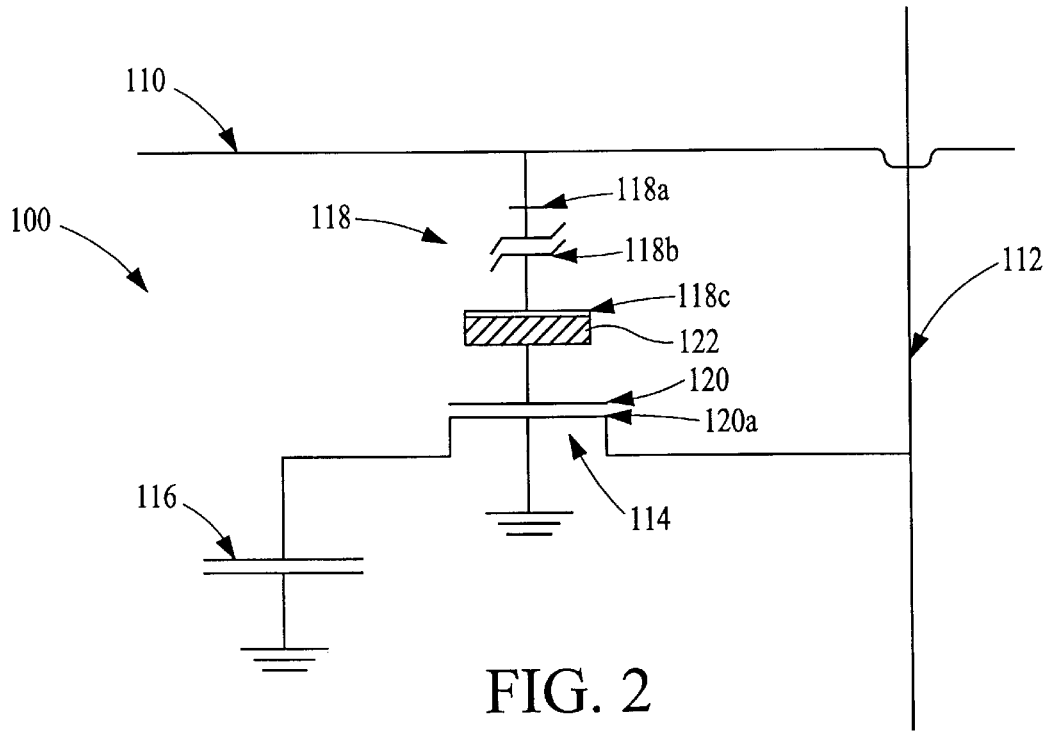
FIG. 2 illustrates a memory cell employing a ferroelectric capacitor according to the present invention.

FIG. 2 illustrates the basic transistor and DRAM memory cell electrical configuration according to the present invention wherein, in addition to the conventional elements of a transistor 114 and a storage capacitor 116, now has a stacked capacitor gate structure including a polysilicon gate capacitance and a small area ferroelectric capacitor. More specifically, the memory cell 100 according to the present invention includes a wordline 110, a digitline 112, a transfer device, e.g., a transistor, 114, a storage capacitor 116 and a ferroelectric capacitor 118. It will be appreciated that the transition between the active region of the transfer device 114 and the polysilicon interconnect 122 to the wordline 110 is an oxide layer 120a, which forms a gate capacitor 120.

Figure 3A:
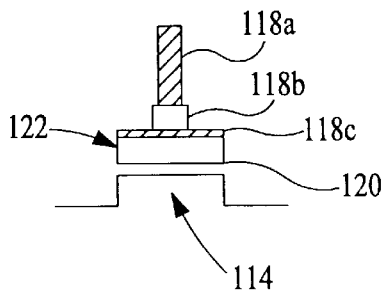
FIG. 3(a) illustrates selected portions of the components used in the memory cell according to FIG. 2.

A more detailed illustration of the transfer device 114, intrinsic gate capacitor 120, polysilicon interconnect 122 and ferroelectric capacitor 118 is provided in FIG. 3(a). It should be mentioned that the ferroelectric capacitor 118 includes Platinum (Pt) electrodes 118a, 118c sandwiching a ferroelectric layer 118b, which will be described in greater detail below. The characteristics of the ferroelectric layer 118b and the gate oxide layer 120a are listed in the table below.

Figure 3B:
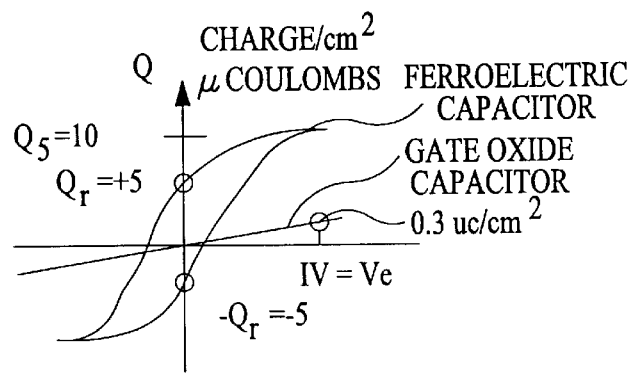
FIG. 3(b) illustrates the hysteresis characteristic of the ferroelectric capacitor employed in the memory cell according to the present invention.

FIG. 3(b) illustrates a hysteresis loop characteristic of ferroelectric material 118b in comparison to the linear response of an oxide material 120a. In FIG. 3(b), $V_c$ indicates coercive voltage, $Q_r$ is remnant charge, $Q_s$ is saturation charge; the Y axis represents charge/centimeter squared in micro-coulombs. It will be appreciated that as long as the applied voltage is less than $V_c$, the charge will follow the linear profiles indicated for layers 118b and 120a. Once $V_c$ has been exceeded, which corresponds to an applied charge of 10 $\mu c/cm^2$, the layer 118b follows the hysteresis profile. Thus, by applying a relatively large voltage, e.g., ±5.0 V, the layer 118b will exhibit a remnant charge $Q_r$, which advantageously can be positive or negative. Since $Q_r$ will effect the threshold voltage $V_{th}$ of transistor 114, the polarity of $Q_r$ can be determined by ascertaining the effect on $V_{th}$, as discussed in greater detail below.

TABLE I

| Layer | Ferroelectric Layer 118b | Gate Oxide Layer 120a |
|---|---|---|
| Thickness | 800 Å | 100 Å |
| Relative Permittivity $\epsilon_r$ | 80 | 4 |
| Area | .2 $\mu m^2$ | 1.0 $\mu m^2$ |
| Capacitance Per Unit Area | 8.85 fF/$\mu m^2$ | 3.54 fF/$\mu m^2$ |
| Capacitance of Device | 1.77 fF | 3.54 fF |

It should also be mentioned that the ferroelectric characteristics depicted above are that of a common ferroelectric, e.g., SrBiTaO, although other ferroelectric materials advantageously can be used, as discussed in greater detail below. It will be appreciated that since the effective dielectric constant of the ferroelectric material is so large, only a small area is required for the ferroelectric capacitor 118. In contrast, the oxide capacitor 120 is the normal gate capacitance of a minimum-sized transistor 114 in CMOS technology. For purposes of illustration, the values presented in Table I are characteristic of 1 micron CMOS technology employing 5V power supplies. It will be appreciated that these values advantageously can be scaled, as appropriate, to smaller CMOS technologies with critical dimensions smaller than 1 micron. As mentioned above, the gate capacitance, i.e., the intrinsic capacitance of capacitor 120, of a transistor 114 in this technology with a gate oxide thickness of approximately 100 Å is about 3.5 fF.

As mentioned above, the charge storage element of a ferroelectric memory cell consists of a ferroelectric film sandwiched between two electrodes. Lead zirconate titanates, $PbZr_xTi_{1-x}O_3$ (PZT) with x=0.4–0.53 are most studied materials for memory applications. It will be appreciated that this is because PZT films with thickness from 500 to 4000 Å can fill the ferroelectric material requirements to a substantial degree. Furthermore, it has been shown that its processing can be done in combination with standard integrated circuit processing, as discussed in the article by R. Cuppens, et al., entitled "Ferroelectrics for Non-volatile Memories" (Microelectronic Engineering, 19 (1992), pp. 245–252, 1992). Other thin-film materials potentially usable for nonvolatile memory devices include $BaMgF_4$ and $Bi_4Ti_3O_{12}$ for application with the ferroelectric material gate insulator in a field effect transistor (FET). Moreover, $BaTiO_3$, $SrTiO_3$ and $(Sr,Ba)TiO_3$ advantageously can be employed for application as dielectrics in DRAMs.

Another important class of ferroelectric materials is the bismuth (Bi)-layer oxides. Bi-layer ferroelectric oxides have large polarization along the a or b axis, but no or little polarization along the c axis. $Bi_4Ti_3O_{12}$ is a typical bi-layer ferroelectric material. However, the obtained remnant polarization is very small, i.e., less than 10 $\mu C/cm^2$ and fatigue endurance is less than optimal. Recently, other types of bi-layer oxides, such as $SrBi_2Ta_2O_9$ or $SrBi_2Nb_2O_9$ have demonstrated acceptable endurance. Amanuma, et al., recently reported a simple solution deposition process of $SrBi_2Ta_2O_9$ (SBT) thin films in the article entitled "Preparation and Ferroelectric Properties of $SrBi_2Ta_2O_9$ Thin Films" (Appl. Phys. Lett., 66 (2), pp. 221–223, 1995).

Referring back to FIG. 3(a), the ferroelectric capacitor 118 is illustrated as a capacitor on top of the gate of the transistor 114, which is connected to the gate of transistor 114 by polysilicon interconnect 122, which is, in an exemplary case, approximately 2000 Å thick. Preferably, the ferroelectric capacitor 118 is fabricated by depositing a ferroelectric material between two Pt plates or electrodes, one of the electrodes, e.g., electrode 118*a*, being a vertical Pt wordline. The ferroelectric capacitor 118 advantageously has an effective plate area of oily about one-fifth that of the gate oxide capacitor 120. Moreover, the ferroelectric dielectric 118*b* will typically be thicker, approximately 800 Å, than the gate oxide 120*a*, approximately 100 Å. It will be appreciated that by properly sizing the ferroelectric capacitor 118 and the intrinsic gate capacitor 120, the gate oxide capacitance and the ferroelectric capacitances can be made comparable. Thus, when the coercive or programming voltage $V_c$ of the ferroelectric capacitor 118 is on the order of 1 volt then the transfer device 114 can be programmed with a voltage as low as 5 volts. It will be appreciated that both of these values are consistent with and, in fact, less than used in 1 micron flash memory CMOS technology.

As will be discussed in greater detail below, the memory cell 100 illustrated in FIG. 2 provides storage sites (capacitors) 116 and 118 for storing volatile (transient) and non-volatile (permanent) data, respectively. Moreover, since data advantageously can be written to capacitor 116 at a relatively low voltage and written to ferroelectric capacitor 118 at a relatively large voltage, the memory cell 100 advantageously includes first and second modes of operation. Additionally, since the first mode of operation is substantially identical to that of a conventional DRAM, tie first operating mode can be termed a dynamic mode of operation. In contrast, since the second mode of operation reads and writes data which is not apparent in the dynamic mode of operation, the second mode of operation can be characterized as a repressed memory mode of operation. Moreover, as will be discussed below, when a plurality of the memory cells 100 are integrated into a memory array, the array advantageously includes two different planes, a dynamic memory plane and a repressed memory plane.

In short, the present invention advantageously can be a one transistor (114)/two capacitor (116, 118) memory cell having first and second modes of operation for storing first and second data types, respectively. According to one aspect of the inventive memory cell, the first mode of operation is a dynamic mode of operation and the second mode of operation is a repressed memory mode of operation. According to another aspect of the invention, one of the two capacitors comprises a ferroelectric capacitor 118.

Moreover, one preferred embodiment of the present invention would include a memory cell 100 having first and second operating modes, including a transistor 114 comprising a gate adjacent to a channel region coupling source and drain regions, a digitline 112 coupled to one of the source and drain regions, a storage capacitor 116 coupled to the other of the source and drain regions, a ferroelectric capacitor 118, and a wordline 110 coupled to the gate by the ferroelectric capacitor 118. Preferably, data is written to and read out of the storage capacitor 116 during the first operating mode and written to and read out of the ferroelectric capacitor 118 during the second mode of operation.

According to one aspect of the inventive memory cell, the gate oxide capacitor, 20, is coupled to the ferroelectric capacitor 118 by polysilicon 122, creating a series capacitor having an intrinsic capacitance. The capacitance of the ferroelectric capacitor 118 is based on the magnitude of the intrinsic capacitance. According to another aspect of the invention, the physical size of the ferroelectric capacitor 118 is based on the magnitude of the intrinsic capacitance. Preferably, the thickness of a ferroelectric material layer in the ferroelectric capacitor 118 is based on the magnitude of the intrinsic capacitance.

The present invention also provides a memory cell 100 storing first and second data types. Preferably, the memory cell includes a transistor 114 with a gate opposing a channel region coupling source and drain regions, a digitline 112 coupled to one of the source and drain regions, a storage capacitor 116, which stores the first type of data, coupled to the other of the source and drain regions, a ferroelectric capacitor 118, which stores the second type of data, and a wordline 110 coupled to the gate by the ferroelectric capacitor. The first type of data can be transient data while the second type of data can be permanent data. According to one aspect of the inventive memory cell discussed immediately above, a first operating voltage required to write the first type of data is less than a second operating voltage required to write the second type of data into the memory cell.

Preferably, the ferroelectric capacitor 118 discussed with respect to any of the exemplary embodiments is an edge-defined ferroelectric capacitor. One exemplary formulation of the ferroelectric material employed in the ferroelectric capacitor comprises a layer of lead zirconate titanate (PZT), preferably PZT in the form $PbZr_xTi_{1-x}O_3$ with x in the approximate of 0.4 to 0.53.

Moreover, the present invention can be employed to form a one transistor/two capacitor (1T/2C) memory cell 140 array, wherein each of the 1T/2C memory cells 100 has first and second modes of operation, the first mode of operation accessing a first memory plane and the second operating mode accessing a second memory plane. Preferably, the first mode of operation is a dynamic mode of operation while the second mode of operation is a repressed memory mode of operation. In an exemplary case, the memory cell array includes N memory cells and, thus, each of the first and second memory planes stores N bits of data. According to one aspect of the invention, the first and second operating modes have respective first and second data writing voltages, the first operating voltage being a predetermined percentage of the second operating voltage.

Figure 4:
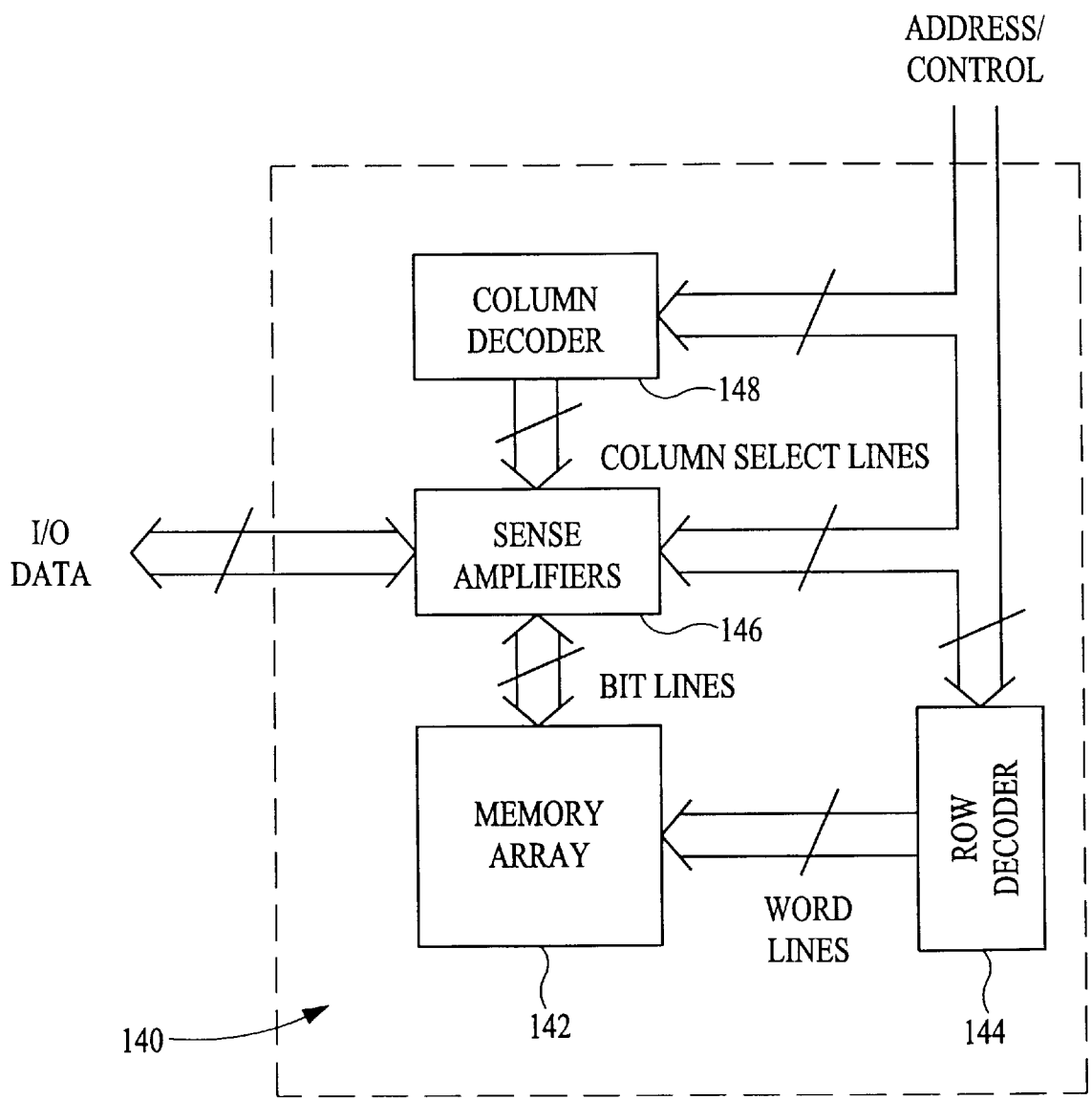
FIG. 4 is a high level block diagram of a memory array device which can be fabricated using the memory cell depicted in FIG. 2.

Referring to FIG. 4, an exemplary DRAM circuit 140 is illustrated. The DRAM 140 contains a memory array 142, row and column decoders 144, 148 and a sense amplifier circuit 146. The memory array 142 consists of a plurality of memory cells 100 (constructed as illustrated in FIG. 2) whose wordlines 110 and digitlines 112 are commonly arranged into rows and columns, respectively. The digitlines 112 of the memory array 142 are connected to the sense amplifier circuit 146, while its wordlines 110 are connected to the row decoder 144. Address and control signals are input into the DRAM 140 and connected to the column decoder 148, sense amplifier circuit 146 and row decoder 144 and are used to gain read and write access, among other things, to the memory array 142.

The column decoder 148 is connected to the sense amplifier circuit 146 via control and column select signals. The sense amplifier circuit 146 receives input data destined for the memory array 142 and outputs data read from the memory array 142 over input/output (I/O) data lines, data is read from the cells of the memory array 142 by activating a wordline (via the row decoder 144), which couples all of the memory cells 100 corresponding to that word line 110 to respective digitlines 112, which define the columns of the array. One or more of the digitlines 112 are also activated. When a particular wordline and bit line are activated, the sense amplifier circuit 146 connected to a digitline column detects and amplifies the data bit transferred from the storage capacitor 116 of the memory cell 100 to its respective bit line 112 by measuring the potential difference between the activated digitline and a reference line which may be an inactive bit line. The operation of DRAM sense amplifiers is described, for example, in U.S. Pat. Nos. 5,627,785, 5,280,205, and 5,042,011, all of which are assigned to Micron Technology Inc., and all of which are incorporated herein by reference for all purposes.

Advantageously, one preferred embodiment of the present invention is a memory cell array storing first and second data types in first and second data storage planes, respectively, including a plurality of memory cells 100 organized as an array of rows and columns, and a sense amplifier 146 coupled to the digitline of the memory cells. Preferably all, but at least one of the memory cells 100, includes a transistor 114 comprising a gate opposing a channel region coupling source and drain regions, a digitline 112 coupled to one of the source and drain regions, a storage capacitor 116, which stores the first type of data, coupled to the other of the source and drain regions, a ferroelectric capacitor 118, which stores the second type of data, and a wordline 110 coupled to the gate by the ferroelectric capacitor. Advantageously, the first data storage plane stores volatile data while the second data storage plane stores non-volatile data. The data is written into the first data storage plane when the wordline or the respective memory cell is at a first potential and data is written to the second data storage plane when the wordline is at a second potential higher than the first potential but below the maximum operating voltage of the transistor.

According to one aspect of the memory cell array mentioned immediately above, the data stored in the first data storage plane corresponds to a charge stored in storage capacitor of the respective memory cell and data stored in the second data storage plane corresponds to the polarization state of the ferroelectric capacitor. Stated another way, the data in the first data storage plane represents the presence or absence of a stored charge and the data in the second data storage plane represents first and second discharge times of the storage capacitor of the respective memory cell. Preferably, both the presence or absence of the stored charge and both the first and second discharge times of the storage capacitor are determined by the sense amplifier. Alternatively, the data in the first data storage plane represents the presence or absence of a stored charge and the data in the second data storage plane represents first and second values of the threshold voltage of the transistor of the respective memory cell. In the latter case, both the presence and absence of the stored charge are determined by the sense amplifier while the first and second values are calculable based on numerical data generated by the sense amplifier.

The operation of the memory cell 100 according to the present invention will now be described while referring to FIGS. 5(a)–5(b), 6(a)–6(f) and 7(a)–7(b).

Figure 5A:
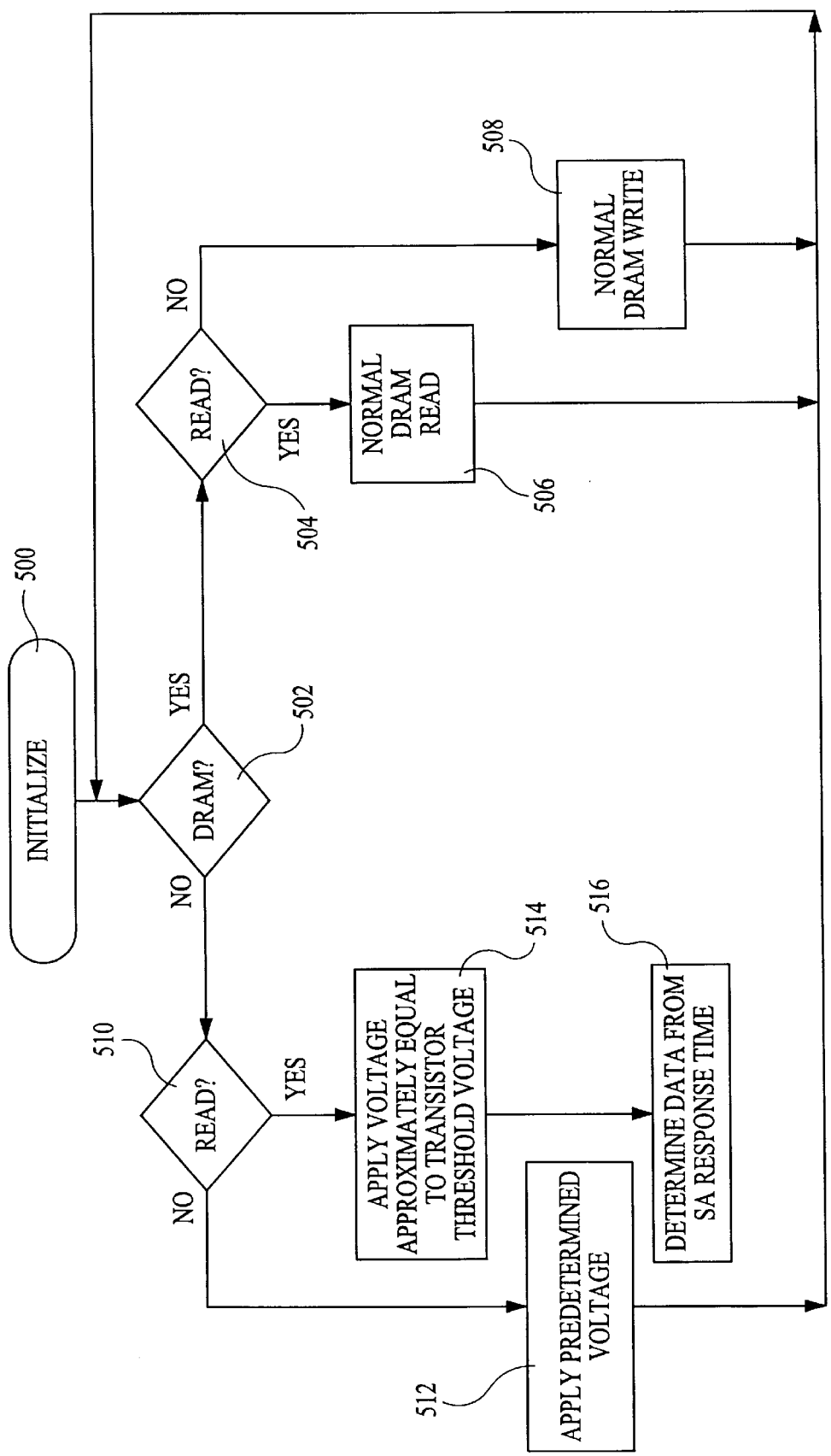
FIGS. 5(a) and 5(b) are flow charts illustrating alternative method for accessing the memory cell according to the present invention depicted in FIG. 2.

Referring now to FIG. 5(a), after the system in which the memory device 142 is located is initialized, a check is first performed to determine whether the memory cells 100 are being accessed as a DRAM or as a nonvolatile memory during step 502. In an exemplary case, dynamic and repressed memory modes of operation advantageously can be signaled by the magnitude of the voltage applied to the wordline. If the memory cells 100 of the memory device 142 are to be operated as a DRAM, an additional check is performed to determine whether a read operation is to be performed during step 504. If the answer is affirmative, a read operation is performed in the normal manner for a DRAM during step 506, which read operation is well known to one of ordinary skill in the art and will not be described further in the interest of brevity. Step 506, i.e., a DRAM write step, which step is well known to one of ordinary skill in the art, is performed when the response at step 504 is negative. Irrespective of whether step 506 or step 508 is performed, step 502 is then repeated. It will be appreciated that as long as the voltage applied to the wordline 110 remains in the normal operating range of the transistor 114, e.g., 3 volts, the coercive voltage of the ferroelectric capacitor 118 is not exceeded and the state of the ferroelectric capacitor is unchanged. See FIGS. 6(a) and 6(b).

Figure 6A:
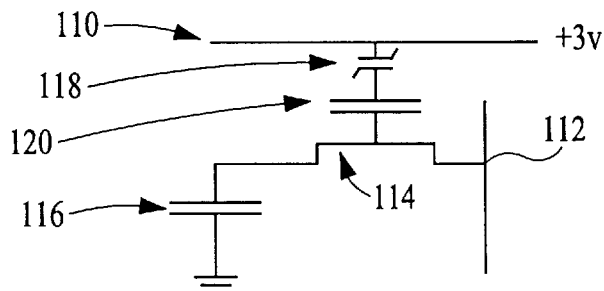
FIGS. 6(a), 6(c) 6(e) illustrate the application of various voltages to selected portions of the circuitry illustrated in FIG. 2.
Figure 6B:
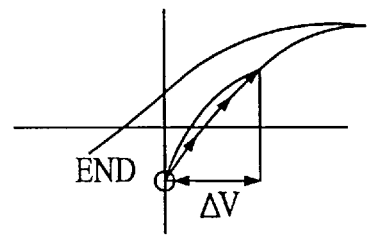
FIGS. 6(b), 6(d) 6(f) are hysteresis diagrams illustrating the effects on the ferroelectric capacitor of the voltages specified in FIGS. 6(a), 6(c) 6(e), respectively.
Figure 6C:
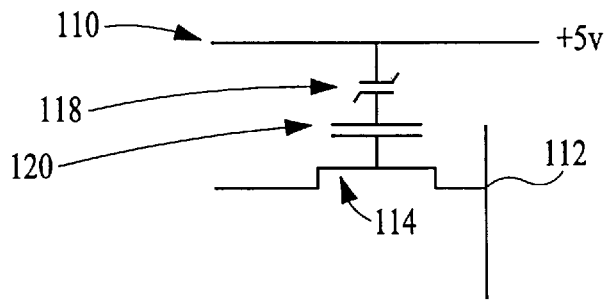
Figure 6D:
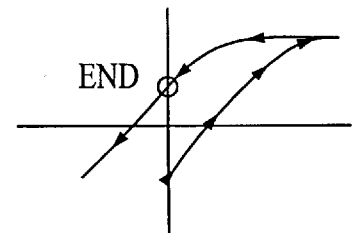
Figure 6E:
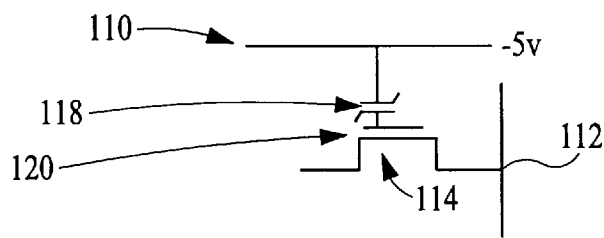
Figure 6F:
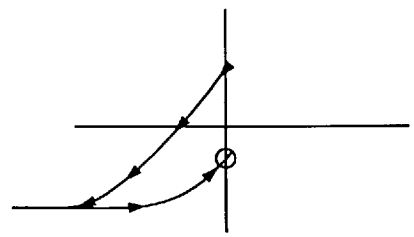

When the answer at step 502 is negative, a further check is performed at step 510 to determine if a read operation is to be performed in the NVRAM mode of operation. If the answer is negative, a voltage in excess of the coercive voltage Vc for the ferroelectric capacitor 118 is applied to the wordline 110 of memory cell 100. It will be appreciated that the value stored in the ferroelectric capacitor 118 is determined by the polarity of the voltage applied. For example, as illustrated in FIGS. 6(c) and 6(d), when a +5 volts potential is applied to wordline 110, a value corresponding to one digital level, e.g., "one," is stored in the ferroelectric capacitor 118. In contrast, application of a −5 volts potential to the wordline results in the opposite digital level, i.e., "zero," being stored in the ferroelectric capacitor 118, as illustrated in FIGS. 6(e) and 6(f). It will also be appreciated that the correspondence between the stored charge polarity and the digital value is arbitrary; a positive potential advantageously can be used to write a digital "zero" into ferroelectric capacitor 118.

It should also be mentioned that storing potential charges in ferroelectric capacitor 118 will effect the threshold voltage of the transfer gate 114, which fact, as discussed in greater detail below, can be used to distinguish between digital values stored in the memory cell 100 during a NVRAM mode of operation. Stated another way, a difference in threshold voltage of the transfer device 114 will have no effect on the potential transferred to the digitline 112, but it will effect the rate at which the charge is transferred. The difference in threshold voltage $V_{TH}$ and resistance of the transfer device 114 determines only the current, but the DRAM sense amplifiers 146 respond only to potential differences. Thus, small changes in the threshold voltage $V_{TH}$ will have no significant impact on the operation of the memory cell 100 in the DRAM mode of operation, since the applied voltage is as much above $V_{TH}$ as possible.

Figure 7A:
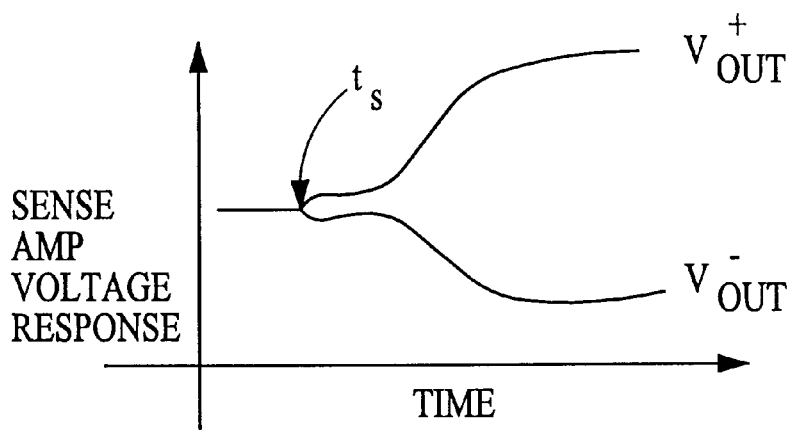
FIGS. 7(a) and 7(b) illustrate the operation of the sense amplifier depicted in FIG. 4 in accordance with the methods set forth in FIGS. 5(a) and 5(b)

It will be noted that the wordline capacitance of the memory cell 100 illustrated in FIG. 2 will be comparable to that in a conventional DRAM since the gate capacitance and the ferroelectric capacitance are in series and, in this exemplary case, collectively about 1 fF. During operation as a normal DRAM, the transistor 114 just transfers a charge from the storage capacitor 116 onto the digitline 112. A difference in the threshold voltage $V_{TH}$ of the transfer device 114 will have no effect on the amount of charge transferred, only the rate at which it is transferred. The difference in threshold voltage determines only the current, but the sense amplifier 146 responds to charge differences in DRAM operation. Smaller differences in threshold voltage $V_{TH}$ may slightly affect the response time, but not the final charge sensed, which is the determining factor in DRAM operation. As shown in FIG. 7(a), during normal DRAM operation, the wordline 110 is driven to a voltage as far as possible in excess of the threshold voltage $V_{TH}$ of the transfer device 114 to minimize the resistance of the transfer device 114, which would typically be a few thousand ohms. This results in the charge being transferred to the digitline capacitance in a sub-nanosecond time period and the sense amplifier 146 subsequently responds quickly.

Figure 7B:
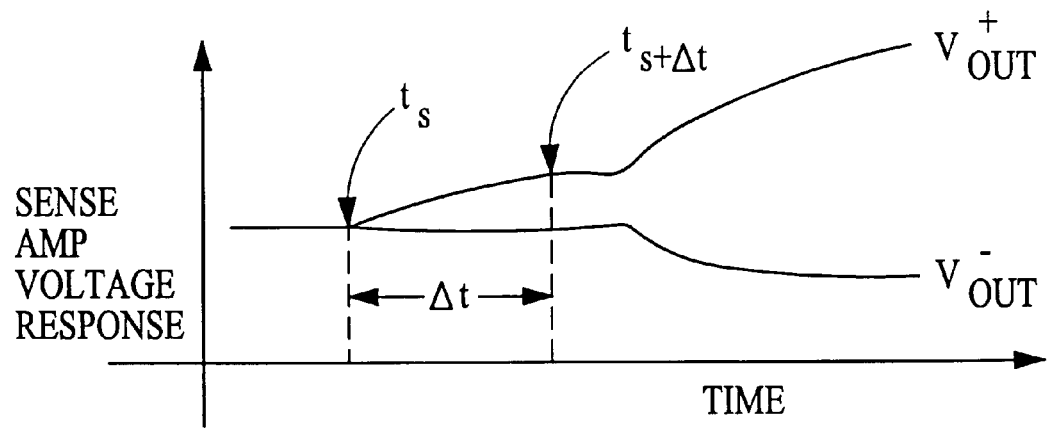

During the NVRAM mode of operation, the DRAM sense amplifier 146 itself advantageously can be employed to determine current differences by observation of the response time of the sense amplifier 146, doing so by using small transfer device currents and observing long response times, as shown in FIG. 7(b). In FIG. 7(b), the wordline 110 is driven to a voltage only slightly in excess of the threshold voltage $V_{TH}$ (during step 514) so that the current through the transfer device 114 is small. This results in a very slow response of the sense amplifier 146. In this manner, differences in threshold voltage $V_{TH}$ can be determined by measuring the differences in response time during step 516.

It should be mentioned at this point that in order to detect this "repressed memory" in the NVRAM mode of operation, sensing time would have to be substantially increased. Using x16 memory structure, it might take as long as 0.1 minute to totally download the repressed data stored in a 64 Meg memory, which is indicative of an individual bit access time of about 1.5 microseconds. While this may seem like a long time, particularly when compared with normal DRAM access times, it will be appreciated that the NVRAM mode of operation would be used only in extraordinary cases where the contents of a memory device was inadvertently lost. Of course, with a shorter access time, the same readout technique advantageously could be used for additional purposes such as "instant" start/recall shutdown.

Figure 5B:
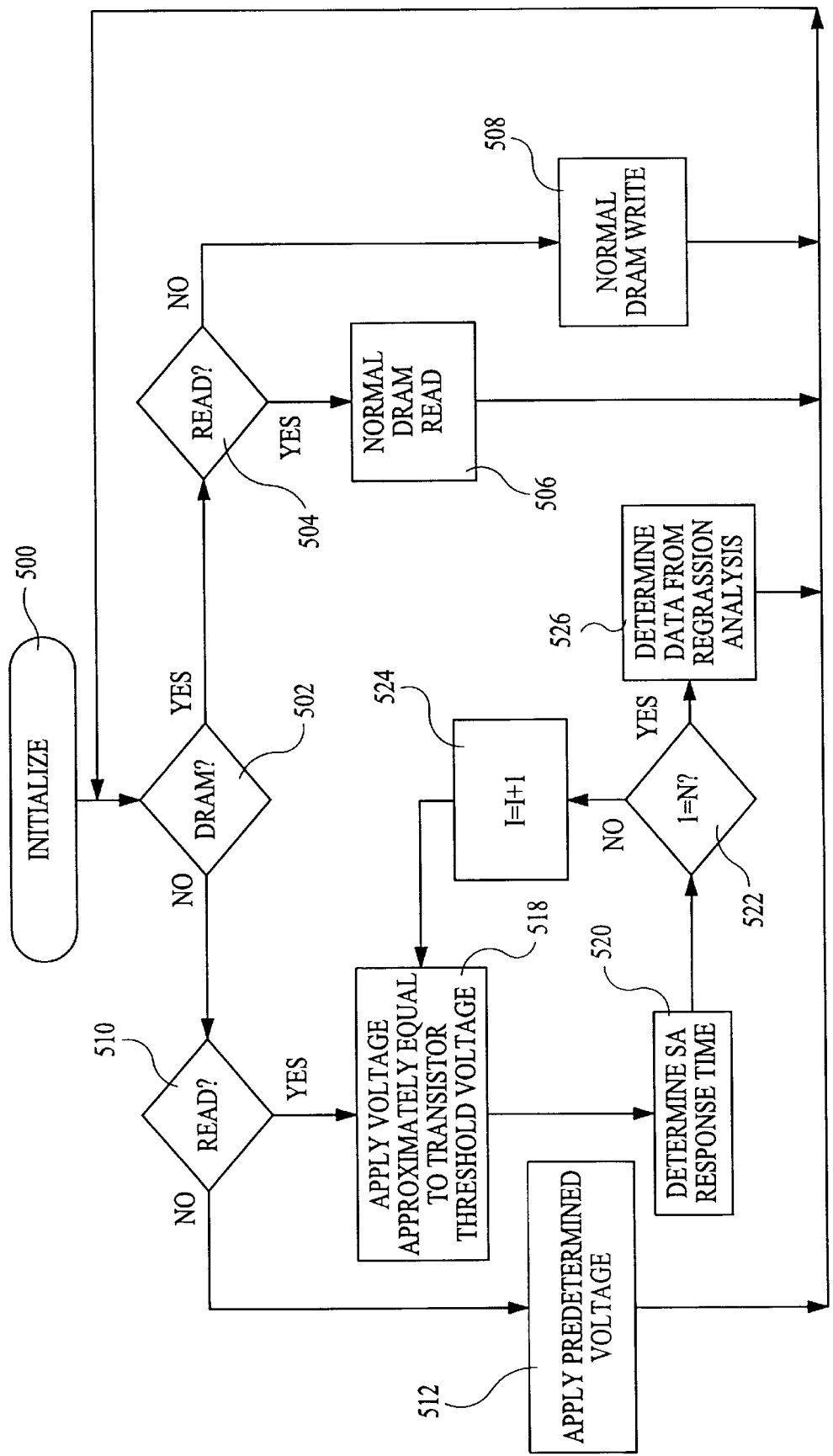

Alternatively, the repressed memory state stored on the floating gate of ferroelectric capacitor 118 can be determined as a separate operation by independently measuring the threshold voltage $V_{TH}$ of the transfer device 114, as illustrated in FIG. 5(b). It will be appreciated that the only difference between the flowcharts of FIG. 5(a) and FIG. 5(b) is the replacement of steps 514 and 516 in FIG. 5(a) with steps 518, 520, 522, 524 and 526 in FIG. 5(b); additional discussion of the steps in FIG. 5(b) repeated from FIG. 5(a) will not be provided.

The storage capacitor 116 can first be fully charged and then the current supplied by the transfer device 114 to the sense amplifier 146 advantageously can be measured at many different gate voltages. More specifically, during step 518, a predetermined gate voltage close to the threshold voltage $V_{TH}$ advantageously can be applied to the transfer device 114 and the response time of the sense amplifier is measured during step 520. A check is then performed at step 522 to determined whether the response time has been measured a predetermined number N of times, where N is a positive integer greater than 1. If a count value I is not equal to N, I is incremented by 1 during step 524 and step 518 is repeated. Then when I=N, a linear regression advantageously can be performed to determine the threshold voltage, i.e., the repressed memory state stored in ferroelectric capacitor, during step 526. This operation will, of course, take much longer than operation as a normal DRAM.

Thus, one exemplary embodiment of the present invention is a method for reading information from a one transistor/two capacitor (1T/2C) memory cell having first and second modes of operation. Preferably the method includes steps for reading a first data value from a first of the two capacitors in the first mode of operation, and reading a second data value derived from a state of a second of the two capacitors. According to one aspect of the inventive method, the transistor includes a control gate, and the step of reading the first data value from the first capacitor in the first mode of operation includes substeps for applying a voltage in excess of a threshold voltage of the transistor to the control gate, and sensing a potential of a charge stored in the first capacitor. Moreover, the step of reading the second data value derived from a state of the second capacitor includes substeps for applying a voltage approximately equal to the threshold voltage of the transistor to the control gate, and sensing a response time of the transistor.

As previously mentioned, the ferroelectric capacitor 118 according to the present invention advantageously can be an edge-defined ferroelectric capacitor. Fabrication of the ferroelectric capacitor will be discussed with respect to FIG. 8. However, before describing an exemplary process for the manufacture of memory cell 100, a brief review of the currently available technology, from which preferred methodology for the fabrication of one type of edge-defined capacitors will be presented. It will be appreciated that the method discussed immediately below advantageously may be applied to other types of edge-defined capacitors.

As discussed above, the charge storage element 118 of a ferroelectric memory cell 100 consists of a ferroelectric film 118b sandwiched between two electrodes 118a, 118c. Lead zirconate titanates, $PbZr_xTi_{1-x}O_3$ (PZT) with x=0.4–0.53 are most studied materials for memory applications, since PZT films with thickness from 500 to 4000 Å can fill the ferroelectric requirements to a substantial degree. Other thin-film materials which advantageously can be employed in nonvolatile memory devices include $BaMgF_4$ and $Bi_4Ti_3O_{12}$ for application with the ferroelectric material gate insulator in FET. $BaTiO_3$, $SrTiO_3$ and $(Sr,Ba)TiO_3$ have demonstrated usefulness in application as dielectrics in DRAMs.

It will be appreciated that the use of sputtering for the deposition of PZT, $Bi_4Ti_3O_{12}$ and oxides was developed from the 1970s. RF diode, magnetron and ion-beam sputtering techniques have all been used with metallic and oxide targets. However, it is difficult to prepare large, dense ceramic targets, which are necessary to obtain uniform layers on large substrates. Therefore, reactive sputtering using metallic targets is more commonly used. Because of the volatility of Pb and PbO, the control of stoichiometry is a major problem, which problem can be minimized by the use of multi-target or multi-target ion beam sputtering. This technique is suitable for edge-defined capacitors.

Alternative techniques for the deposition of PZT films include Metal Organic Deposition (MOD) and sol-gel process. With these processes, the ferroelectric film is formed by the thermal decomposition of a solution of organo metallic compounds which can be spun onto the substrate. The subsequent drying, firing and annealing processes of the film strongly influence the morphology and ferroelectric properties of the PZT. It should be mentioned that thicker films can be obtained by repeating the spinning, drying and firing sequence. The main advantage of these processes is the ease by which complex oxide films can be prepared. These techniques are applicable to edge-defined capacitors.

Yet another technique which is useful in the fabrication of ferroelectric capacitors is Organo Metallic Chemical Vapor Deposition (OMCVD), which offers advantages such as good step coverage, high deposition rate, and low-temperature deposition (16), and is particularly suitable to a type of edge-defined capacitors which might have ferroelectric material on a sidewall. Additionally, an ozone jet reactive evaporation technique has been developed to deposit thin lead zirconate titanate films. It will be appreciated that because lead has a low affinity with oxygen and high volatility, lead may re-evaporate from the film and/or diffuse into the electrode and leave lead vacancies in PZT films. In a sol-gel or sputtering process, excess lead is often added to compensate for this lead loss. However, problems resulting from lead diffusion into surrounding electrode material was not elevated by this practice. For a chemical vapor deposition (CVD) process, since the wafer is being heated during film deposition, unreacted lead may easily diffuse into the electrode material. To mitigate the problems associated with metallic lead or less oxidized lead in the film, it was common to employ high-concentration ozone to oxidize lead vapor at low temperature, and obtain a fully oxidized amorphous films by the co-evaporation method. Rapid thermal annealing (RTA), 650° C. for 120 seconds in oxygen ambient, is then used to crystallize the amorphous film into perovslute structure without lead re-evaporation or lead diffusion. It will be appreciated that this technique is particularly well suited to the fabrication of edge-defined capacitors. Other methods for the preparation of ferroelectric thin films include molecular beam epitaxy (MBE), although is difficult to comply with competing requirements of IC production processes such as large wafers, high throughput, etc.

It will also be appreciated that an important parameter, one which will influence the properties of the ferroelectric capacitors, are the electrodes. Because of the chemical reactivity of PZT and related materials and relatively high processing temperatures (>600° C.), a very inert bottom electrode is required. In general, Pt-based electrodes are used which are deposited onto silicon oxide or nitride by sputtering using an adhesive layer such as TiN, Ti, or the two in combination. Although relatively inert, the Pt bottom electrode does affect the morphology and the ferroelectric properties of the PZT films and related materials.

It has been reported in the literature that better hysteresis properties of PZT films (by sol-gel process) are achievable when the PZT is deposited onto a multilayer stack of $Pt/RuO_2/PZT/RuO_2/Pt$. It is speculated that the microstructure, in particular the grain size of PZT, of the PZT films were influenced by $RuO_2$. Beneficially, films with smaller grain sizes had larger coercive fields. In addition, the effect of microstructure on the electrical characteristics of sol-gel derived PZT thin films deposited on a Pt electrode have been demonstrated using different solutions, i.e., films with different degree of preferred orientation of the perovskite crystal as well as different grain size were obtained. It is believed that while smaller grains are generally desired to obtain good device to device uniformity, their electrical properties have to be considered before they can be deemed suitable for either NVRAM or DRAM applications.

As previously mentioned, another class of ferroelectric materials is the bismuth (Bi)-layer oxides. Bi-layer ferroelectric oxides have large polarization along the a or b axis, but no or little polarization along the c axis. $Bi_4Ti_3O_{12}$ is a typical bi-layer ferroelectrics, and the synthesis of this material has been reported. However, the obtained remnant polarization is very small, less than $10\ ^\mu C/cm^2$ and fatigue endurance is poor. Recently, other types of bi-layer oxides, such as $SrBi_2Ta_2O_9$ or $SrBi_2Nb_2O_9$ were found to have good endurance.

Figure 8B:
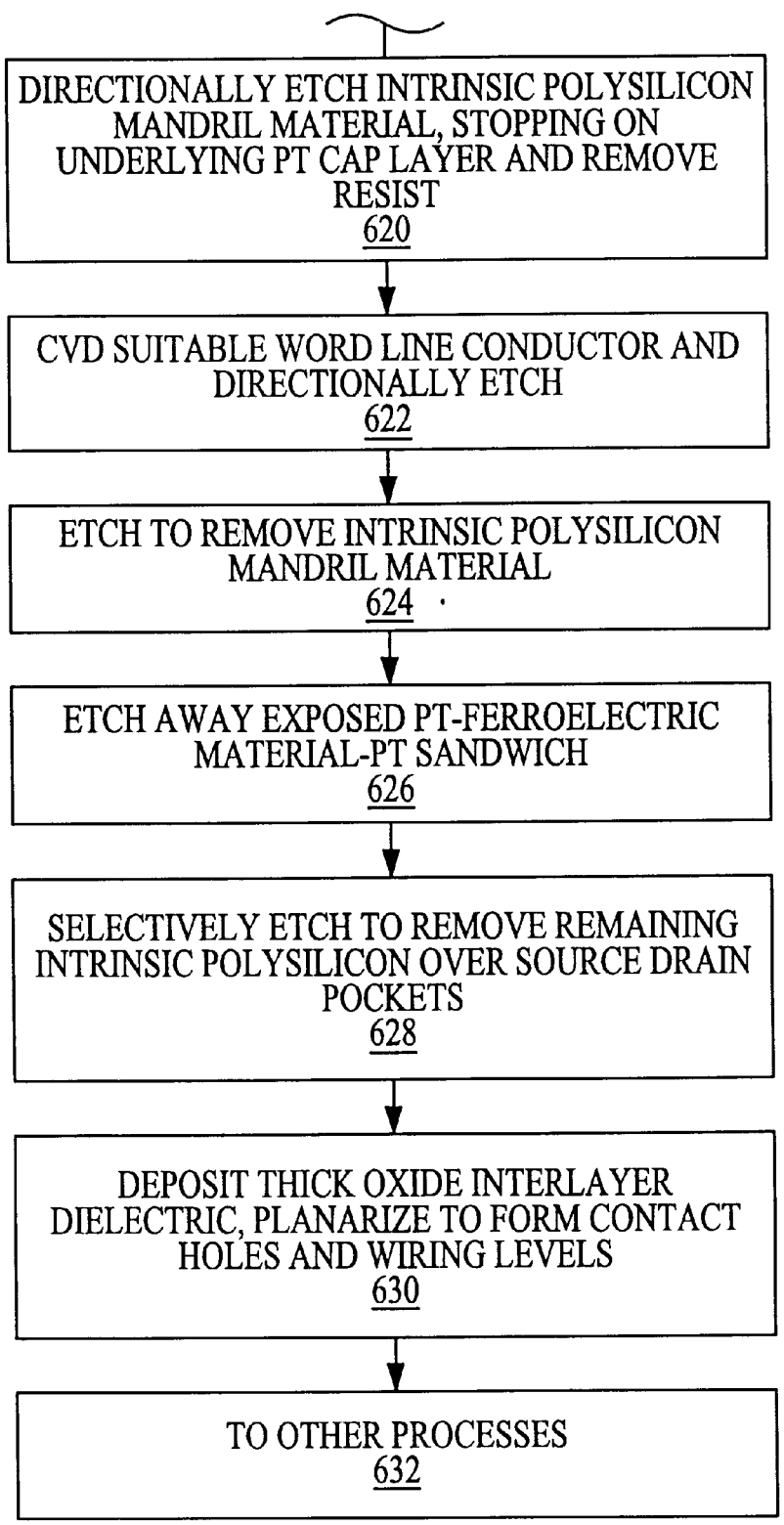
FIG. 8 is a flow chart illustrating the process flow for fabricating the memory cell illustrated in FIG. 2.
Figure 9A:
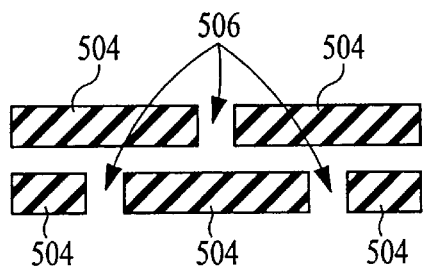
FIGS. 9(a) through 9(l) illustrate one of plan and section view of a workpiece at various steps of the process flow illustrated in FIG. 8.

Referring now to FIGS. 8 and 9(a) ... 9(l), a process flow for integration of ferroelectric capacitors into the memory devices 140 will now be described. It should be mentioned at this point that such integration requires careful attention so as not to degrade the ferroelectric properties of the film. One example of process integration with a stacked capacitor structure was shown by Onish, et al., in the article entitled "A Half-Micron Ferroelectric Memory Cell Technology with Stacked Capacitor Structure," (1994 IEDM Digest, pp. 843–846, 1994). However, an alternative exemplary process flow is described below which advantageously can be employed in fabricating the ferroelectric capacitors with spacer-defined wordlines. It should also be mentioned that the process flow described below advantageously can be employed in fabricating memory cell pairs sharing a common digitline.

Figure 9B:
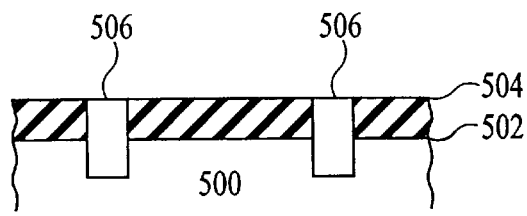

The process flow starts with a workpiece 500, e.g., a wafer fragment, following well formation and growth of a thin (e.g., ~10 nm) pad of thermal oxide 502 followed by growth of a thick pad of nitride 504 (~0.2 μm) for formation of STI (shallow trench isolation) during step 600. During step 602, resist is applied and masked, isolation trenches are etched and filled with oxide 506 and the structure is subjected to chemical mechanical processing (CMP), as in other, conventional process flows. This leaves the structure as shown in FIGS. 9(a) and 9(b).

Figure 9C:
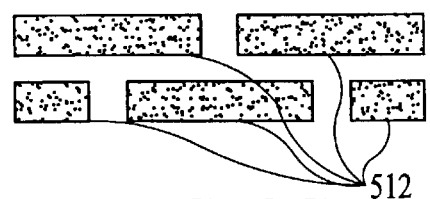
Figure 9D:
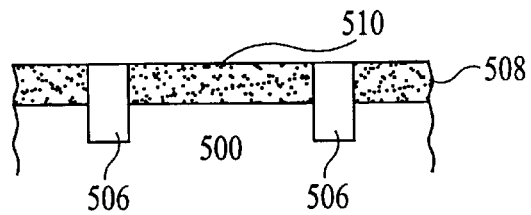

During step 604, the pad nitride 504 and oxide 502 are removed to expose bare silicon in the active areas, preferably recessed relative to the STI surface. Next, during step 606, gate oxide 508 is grown, prior to depositing polysilicon gate material 510 and subsequent C(MP finishing to leave structure as shown in FIGS. 9(c) and 9(d).

Figure 9E:
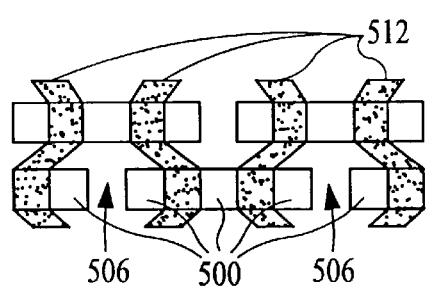
Figure 9F:
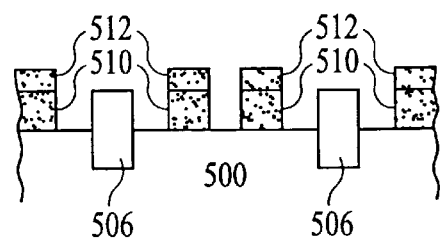

During step 608, a resist 512 is applied, the gate pattern is exposed, and the wafer is etched to produce the intermediate product depicted in FIGS. 9(e) and 9(f).

During step 610, the resist 512 is removed and the source/drain pockets 514 are ion implanted and annealed. During step 612, the wafer can be finished to restore surface planarity by chemical vapor deposition (CVD) and TEOS or intrinsic polysilicon 510 followed by another round of CMP.

Figure 9G:
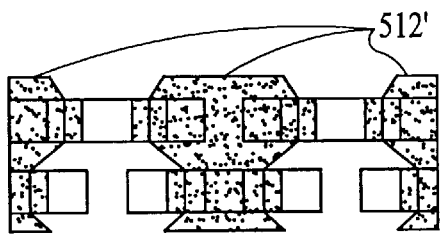
Figure 9H:
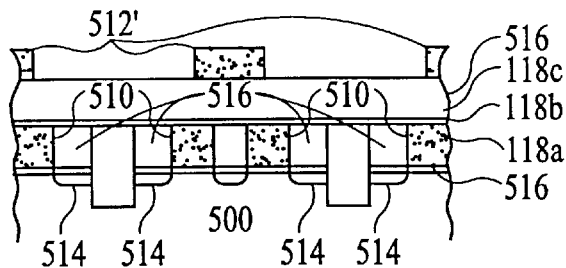

During step 614, the ferroelectric capacitor 118 is formed by depositing a Pt layer 118a, a ferroelectric material layer 118b, and a final Pt cap layer 118c. It will be appreciated that any of the deposition processes discussed in detail above advantageously can be employed in depositing the ferroelectric material layer. Moreover, the ferroelectric capacitor material 118b advantageously can be chosen from the non-limiting list of materials presented above. During step 618, intrinsic polysilicon 516 is deposited to a thickness equal to the desired height of the final spacer defined word lines (e.g., 0.2 μm). Then a resist 512' is applied and masked to define word line edge pattern illustrated in FIGS. 9(g) and 9(h) during step 620.

Figure 9I:
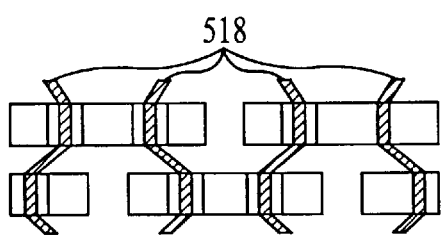
Figure 9J:
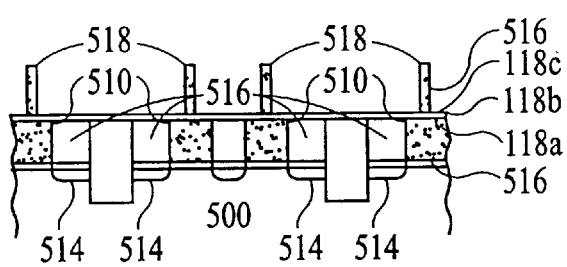
Figure 9K:
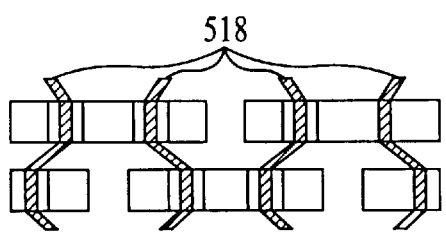
Figure 9L:
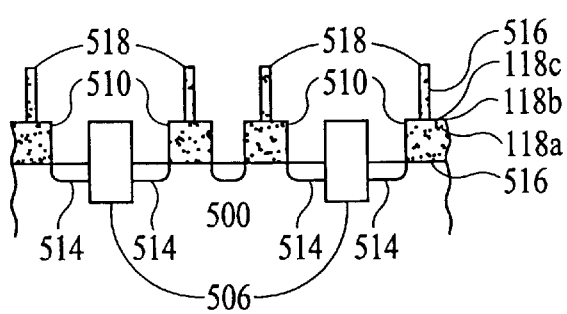

During step 622, the intrinsic polysilicon mandril material is directionally etched, preferably stopping on underlying Pt cap layer 118c and then the resist 512' is removed. During step 624, a suitable word line conductor 518 (e.g., doped polysilicon, refractory metal or silicide) is deposited by CVD and then directionally etched to leave conductor 518 as a spacer on the vertical edges of the mandril, as shown in FIGS. 9(i) and 9(j). At step 624 a second mask and etch step is then applied to remove unwanted sidewall material at the ends of features and then a suitable selective etchant is employed to remove intrinsic polysilicon 516 mandril material. In step 628, the exposed Pt-ferroelectric material-Pt sandwich 118a, 118b, 118c is etched away. If at step 612 intrinsic polysilicon was deposited then during step 630, the workpiece 500 is selectively etched to remove any remaining intrinsic polysilicon 516 over the source/drain pockets 514, leaving the structure shown in FIGS. 9(k) and 9(l). If TEOS was deposited in step 612, then step 630 can be omitted.

Finally, during step 632, a thick oxide interlayer dielectric is deposited and planarized and processed to form contact holes, a cell capacitor, e.g. 116 FIG. 2, connects between one of a source and drain region and a digit line, between the ferroelectric capacitor and a wordline, and wiring levels, as in conventional DRAM processing.

Figure 10:
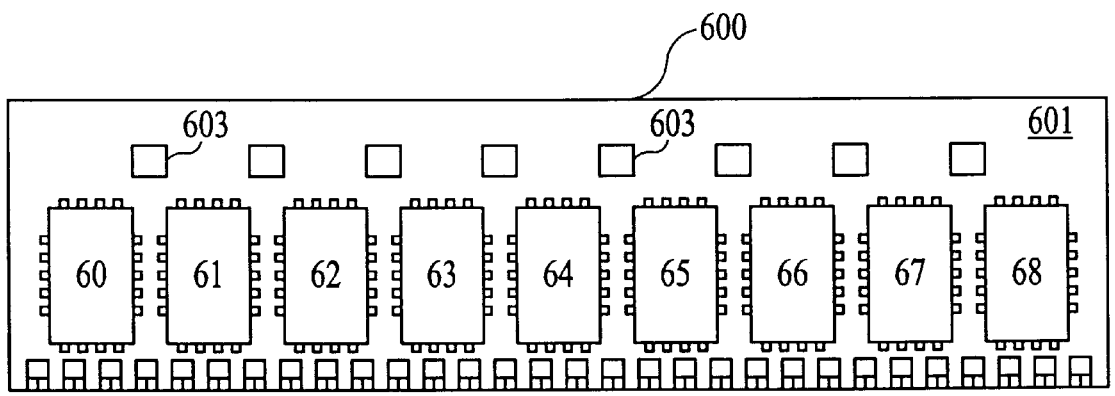
FIG. 10 is a plan view of a memory module having memory chips constructed according to the present invention.

FIG. 10 is plan view of a memory module 600 having memory chips 60–68 including semiconductor memory devices constructed in accordance with the present invention. That is, chips 60–68 have a DRAM cell such as described in connection with FIG. 2. Memory module 600 is a SIMM (single in line memory module) having nine memory chips (IC's) 60–68 aligned on one side of a printed circuit board substrate. The number of such memory chips in the SIMM typically will vary between 3 to 9. The circuit board 601 has an edge connector 602 along one longitudinal edge to permit it to plug into a memory socket on a computer motherboard of conventional design (not shown). A wiring pattern (not shown), which can be a conventionally known design for this purpose, is formed on the board 601 and connects the terminals or leads shown comprising the edge connector 602 to the memory chips 60–68. Small ceramic decoupling capacitors 69 are also mounted on substrate 601 to suppress transient voltage spikes. Other than the memory device structures formed in accordance with the inventive method and used in memory chips 60–68, the general layout of the SIMM 600 can be a conventional construction.

Thus, another exemplary embodiment of the present invention is a memory module, including a die substrate comprising a circuit board, a plurality of memory chips mounted on the die substrate, wherein one or more of the memory chips includes a memory cell array fabricated on the semiconductor chip communicating with the processor, discussed below. Preferably, the memory cell array includes a plurality of one transistor/two capacitor (1T/2C) memory cells, each of the 1T/1C, memory cells having first and second modes of operation, the first mode of operation accessing a first memory plane and the second operating mode accessing a second memory plane.

Figure 11:
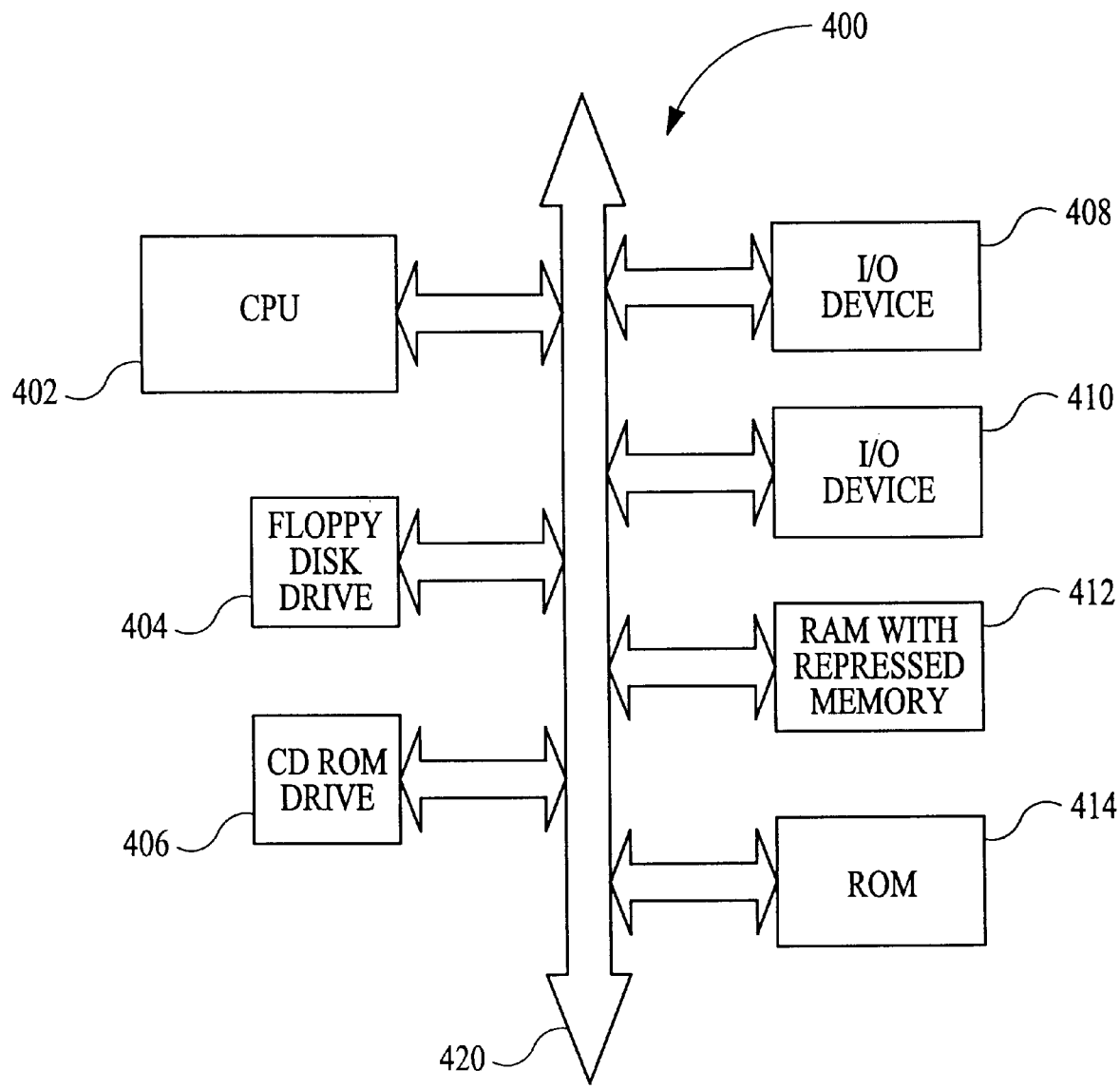
FIG. 11 is a high level block diagram of a processor-based system employing RAM including memory chips constructed according to the present invention.

FIG. 11 is a block diagram of a processor-based system 400 utilizing RAM with repressed memory 412 constructed in accordance with the present invention. That is, the RAM 412 utilizes the DRAM cell 100 illustrated in FIG. 2. The processor-based system 400 may be a computer system, a process control system or any other system employing a processor and associated memory. The system 400 includes a central processing unit (CPU) 402, e.g., a microprocessor, that communicates with the RAM 412 and an I/O device 408 over a bus 420. It must be noted that the bus 420 may be a series of buses and bridges commonly used in a processor-based system, but for convenience purposes only, the bus 420 has been illustrated as a single bus. A second I/O device 410 is illustrated, but is not necessary to practice the invention. The processor-based system 400 also includes read-only memory (ROM) 414 and may include peripheral devices such as a floppy disk drive 404, a compact disk (CD) ROM drive 406, a display (not shown), a key board (not shown), and a mouse (not shown), that communicate with the CPU 402 over the bus 420 as is well known in the art.

Thus, another preferred embodiment of the present invention includes a processor based system, having a processor, and a memory cell array storing first and second data types in first and second data storage planes, respectively. Preferably, the memory cell array includes multiple memory cells organized as an array of rows and columns, at least one of the memory cells 100 including a transistor having a gate opposing a channel region coupling source and drain regions, a digitline coupled to one of the source and drain regions, a storage capacitor, which stores the first type of data, coupled to the other of the source and drain regions, a ferroelectric capacitor, which stores the second type of data, and a wordline coupled to the gate by the ferroelectric capacitor, and a sense amplifier coupled to the digitline of the at least one memory cell. Preferably, the first data storage plane of the memory cell array stores volatile data while the second data storage plane of the memory cell array stores non-volatile data.

According to one aspect of the invention discussed immediately above data is written into the first data storage plane when the wordline is at a first potential, and data is written to the second data storage plane when the wordline is at a second potential higher that the first potential but below the maximum operating voltage of the transistor, all writes being under the control of the processor.

According to another aspect of the invention under discussion, data in the first data storage plane represents the presence or absence of a stored charge and the data in the second data storage plane represents first and second values of the threshold voltage of the transistor of the respective memory cell. Advantageously, both the presence and absence of the stored charge are determined by the sense amplifier while the first and second values are calculated by the processor based on raw data generated by the sense amplifier.

It should be mentioned that the repressed memory function provided in the memory cell 100 according to the present invention advantageously could be utilized in applications which require a read or write operation only occasionally, e.g., on start-up, or restart from a protected mode as discussed in U.S. Pat. No. 5,497,494 ("Method for saving and restoring the state of a CPU executing code in a protected mode"), or fault tolerant systems as described in U.S. Pat. No. 5,619,642 ("Fault Tolerant Memory System Which Utilizes Data from a Shadow Memory Device upon the Detection of Erroneous Data in a Main Memory Device"). This repressed memory does not only and necessarily function like a shadow memory, storing the same information as the DRAM, but rather a separate and independent NVRAM. It could, however, be used as a shadow RAM for instant information. Principal and secondary data, permanently stored in the NVRAM, could then be transferred to the much faster DRAM as disclosed in U.S. Pat. No. 5,603,011 ("Selective Shadowing and Paging in Computer Memory Systems") to enable start-up and operation.

It should again be mentioned that all of the patents, patent applications, and articles cited to or discussed above are incorporated herein by reference for all purposes.

Although presently preferred embodiments of the present invention have been described in detail hereinabove, it should be clearly understood that many variations and/or modifications of the basic inventive concepts herein taught, which may appear to those skilled in the pertinent art, will still fall within the spirit and scope of the present invention, as defined in the appended claims.

What is claimed is:

1. A memory cell comprising:
one transistor; and a first capacitor coupled to a gate and a second capacitor coupled to one of a source and a drain region of said transistor, said transistor and said first and second capacitors being arranged to operate in first and second modes of operation which store volatile data and non-volatile data, respectively in said capacitors.

2. The memory cell as recited in claim 1, wherein the first mode of operation is a dynamic mode of operation.

3. The memory cell as recited in claim 1, wherein the second mode of operation is a repressed memory mode of operation.

4. The memory cell as recited in claim 1, wherein one of said first and second capacitors comprises a ferroelectric capacitor.

5. A memory cell having first and second operating modes, comprising:
a transistor comprising a gate adjacent to a channel region coupling source and drain regions;
a digitline coupled to one of the source and drain regions;
a storage capacitor coupled to the other of the source and drain regions,
a ferroelectric capacitor; and
a wordline coupled to the gate by the ferroelectric capacitor,
wherein data is written to and read out of the storage capacitor during the first operating mode and written to and read out of the ferroelectric capacitor during the second mode of operation.

6. The memory cell as recited in claim 5, wherein the first mode of operation is a dynamic mode of operation.

7. The memory cell as recited in claim 5, wherein the second mode of operation is a repressed memory mode of operation.

8. The memory cell as recited in claim 5, wherein:
the gate is coupled to the ferroelectric capacitor by polysilicon;
the junction formed at the gate has an intrinsic capacitance; and
the capacitance of the ferroelectric capacitor is based on the magnitude of the intrinsic capacitance.

9. The memory cell as recited in claim 5, wherein:
the gate is coupled to the ferroelectric capacitor by polysilicon;
the junction formed at the gate has an intrinsic capacitance; and
the physical size of the ferroelectric capacitor is based on the magnitude of the intrinsic capacitance.

10. The memory cell as recited in claim 9, wherein the thickness of a ferroelectric material layer in the ferroelectric capacitor is based on the magnitude of the intrinsic capacitance.

11. A memory cell storing first and second data types, comprising:
a transistor comprising a gate opposing a channel region coupling source and drain regions;
a digitline coupled to one of the source and drain regions;
a storage capacitor, which stores the first type of data, coupled to the other of the source and drain regions,
a ferroelectric capacitor, which stores the second type of data; and
a wordline coupled to the gate by the ferroelectric capacitor.

12. The memory cell as recited in claim 11, wherein the first type of data is transient data.

13. The memory cell as recited in claim 11, wherein the second type of data is permanent data.

14. The memory cell as recited in claim 11, wherein:
the gate is coupled to the ferroelectric capacitor by polysilicon;
the junction formed at the gate has an intrinsic capacitance; and
the capacitance of the ferroelectric capacitor is based on the magnitude of the intrinsic capacitance.

15. The memory cell as recited in claim 11, wherein:
the gate is coupled to the ferroelectric capacitor by polysilicon;
the junction formed at the gate has an intrinsic capacitance; and
the physical size of the ferroelectric capacitor is based on the magnitude of the intrinsic capacitance.

16. The memory cell as recited in claim 11, wherein a first operating voltage required to write the first type of data is less than a second operating voltage required to write the second type of data into the memory cell.

17. The memory cell as recited in claim 11, wherein the ferroelectric capacitor is an edge-defined ferroelectric capacitor.

18. The memory cell as recited in claim 11, wherein the ferroelectric capacitor comprises a dielectric layer of lead zirconate titanate (PZT).

19. The memory cell as recited in claim 18, wherein the PZT comprising the ferroelectric capacitor is of the form $PbZr_xTi_{1-x}O_3$ with x ranging between 0.4 and 0.53.

20. A memory cell array comprising:
a plurality of memory cells, each being formed by an arrangement of one transistor and a first capacitor coupled to a gate and a second capacitor coupled to one of a source and a drain region of said transistor, wherein each of the memory cells has first and second modes of operation, the first mode of operation accessing said first capacitor in a first memory plane and the second operating mode accessing said second capacitor in a second memory plane.

21. The memory cell array as recited in claim 20, wherein the first mode of operation is a dynamic mode of operation.

22. The memory cell array as recited in claim 20, wherein the second mode of operation is a repressed memory mode of operation.

23. The memory cell array as recited in claim 20, wherein the memory cell array comprises N memory cells, and wherein each of the first and second memory planes stores N bits of data.

24. The memory cell array as recited in claim 20, wherein the first and second operating modes have respective first and second data writing voltages, and wherein the first data writing voltage is a predetermined percentage of the second data writing voltage.

25. The memory cell array as recited in claim 24, wherein said first data writing voltage is greater than the threshold voltage of the transistor.

26. A memory cell array which stores first and second data types in first and second data storage planes, respectively, comprising:
   a plurality of memory cells organized as an array of rows and columns, at least one of the memory cells comprising:
   a transistor comprising a gate opposing a channel region coupling source and drain regions;
   a digitline coupled to one of the source and drain regions;
   a storage capacitor, which stores the first type of data, coupled to the other of the source and drain regions,
   a ferroelectric capacitor, which stores the second type of data; and
   a wordline coupled to the gate by the ferroelectric capacitor; and
   a sense amplifier coupled to the digitline of the at least one memory cell.

27. The memory cell array as recited in claim 26, wherein the first data storage plane stores volatile data.

28. The memory cell array as recited in claim 26, wherein the second data storage plane stores non-volatile data.

29. The memory cell array as recited in claim 26, wherein data is written into the first data storage plane when the wordline is at a first potential and wherein data is written to the second data storage plane when the wordline is at a second potential higher than the first potential but below the maximum operating voltage of the transistor.

30. The memory cell array as recited in claim 26, wherein data stored in the first data storage plane corresponds to charge stored in storage capacitor of the memory cell and wherein data stored in the second data storage plane corresponds to the polarization state of the ferroelectric capacitor.

31. The memory cell array as recited in claim 26, wherein data in the first data storage plane represents the presence or absence of a stored charge and the data in the second data storage plane represents first and second discharge times of the storage capacitor of the respective memory cell.

32. The memory cell array as recited in claim 31, wherein both the presence or absence of the stored charge and both the first and second discharge times of the storage capacitor are determined by the sense amplifier.

33. The memory cell array as recited in claim 26, wherein data in the first data storage plane represents the presence or absence of a stored charge and the data in the second data storage plane represents first and second values of the threshold voltage of the transistor of the respective memory cell.

34. The memory cell array as recited in claim 33, wherein both the presence and absence of the stored charge are determined by the sense amplifier and wherein the first and second values are calculable based on numerical data generated by the sense amplifier.

35. A processor based system, comprising:
   a processor; and
   a memory cell array coupled to the processor, the memory cell array storing first and second data types in first and second data storage planes, respectively, the memory cell array including a plurality of memory cells organized as an array of rows and columns, at least one of the memory cells comprising:
   a transistor comprising a gate opposing a channel region coupling source and drain regions;
   a digitline coupled to one of the source and drain regions;
   a storage capacitor, which stores the first type of data, coupled to the other of the source and drain regions,
   a ferroelectric capacitor, which stores the second type of data;
   a wordline coupled to the gate by the ferroelectric capacitor; and
   a sense amplifier coupled to the digitline of the at least one memory cell.

36. The processor based system as recited in claim 35, wherein the first data storage plane of the memory cell array stores volatile data.

37. The processor based system as recited in claim 35, wherein the second data storage plane of the memory cell array stores non-volatile data.

38. The processor based system as recited in claim 35, wherein, under the control of the processor:
   data is written into the first data storage plane when the wordline is at a first potential; and
   data is written to the second data storage plane when the wordline is at a second potential higher that the first potential but below the maximum operating voltage of the transistor.

39. The processor based system as recited in claim 35, wherein data in the first data storage plane represents the presence or absence of a stored charge and the data in the second data storage plane represents first and second values of the threshold voltage of the transistor of the respective memory cell.

40. The processor based system as recited in claim 39, wherein both the presence and absence of the stored charge are determined by the sense amplifier and wherein the first and second values are calculated by the processor based on raw data generated by the sense amplifier.

41. A memory module, comprising:
   a substrate comprising a circuit board;
   a plurality of memory chips mounted on the substrate, wherein one or more of the memory chips comprise a memory cell array fabricated on the semiconductor chip communicating with a processor, said memory cell array comprising:
   a plurality of one transistor/two capacitor (1T/2C) memory cells, wherein the 1T/2C memory cell comprises: a transistor comprising a gate adjacent to a channel region coupling source and drain regions; a digitline coupled to one of the source and drain regions; a storage capacitor coupled to the other of the source and drain regions, a ferroelectric capacitor; and a wordline coupled to the gate by the ferroelectric capacitor,
   wherein each of the 1T/2C memory cells has first and second modes of operation, the first mode of operation accessing said first capacitor and the second operating mode accessing said second capacitor.

42. The memory module as recited in claim 41, wherein the first mode of operation is a dynamic mode of operation.

43. The memory module as recited in claim 41, wherein the second mode of operation is a repressed memory mode of operation.

44. The memory module as recited in claim 41, wherein the memory cell array comprises N memory cells, and wherein each of the first and second memory planes stores N bits data.

45. The memory module as recited in claim 41, wherein the first and second operating modes have respective first and second data writing voltages, and wherein the first operating voltage is a predetermined percentage of the second operating voltage.

46. The memory module as recited in claim 45, wherein said first operating voltage is greater than the threshold voltage of the transistor.

47. A method for reading information from a one transistor/two capacitor (1T/2C) memory cell in which a first capacitor is coupled to a gate and a second capacitor is coupled to one of a source and a drain region of said transistor, the method comprising:

reading a first data value from a first of the two capacitors in a first mode of operation; and reading a second data value from a second of the two capacitors in a second mode of operation.

48. The method as recited in claim 47, wherein the first mode of operation is a dynamic mode of operation.

49. The method as recited in claim 47, wherein the second mode of operation is a repressed memory mode of operation.

50. The method as recited in claim 47, wherein one of the two capacitors comprises a ferroelectric capacitor.

51. The method as recited in claim 47, wherein the transistor further comprises a control gate, and wherein the step of reading the first data value from the first capacitor in the first mode of operation comprises:

applying a voltage a voltage in excess of a threshold voltage of the transistor to the control gate; and sensing a potential of a charge stored in the first capacitor.

52. The method as recited in claim 47, wherein the transistor further comprises a control gate, and wherein the step of reading the second data value derived from a state of the second capacitor comprises:

applying a voltage approximately equal to the threshold voltage of the transistor to the control gate; and sensing a response time of the transistor.

53. A method for writing information to a one transistor/two capacitor (1T/2C) memory cell in which a first capacitor is coupled to a gate and a second capacitor is coupled to one of a source and a drain region of said transistor, the method comprising:

writing a first data value to a first of the two capacitors in a first mode of operation; and writing a second data value to a second of the two capacitors in a second mode of operation.

54. The method as recited in claim 52, wherein the first mode of operation is a dynamic mode of operation.

55. The method as recited in claim 54, wherein the second mode of operation is a repressed memory mode of operation.

56. The method as recited in claim 52, wherein one of the two capacitors comprises a ferroelectric capacitor.

57. The method as recited in claim 52, wherein the second of the two capacitors comprises a ferroelectric capacitor and wherein the step of writing the second data value further comprises applying a potential greater than the coercive voltage of the ferroelectric capacitor to thereby write the second data value to the ferroelectric capacitor.

58. The method as recited in claim 52, wherein a predetermined digital value is written into the ferroelectric capacitor when the applied potential has a predetermined polarity.

59. A method for forming a memory cell, said method comprising:

forming source and drain regions in a substrate well;

forming a gate between said source and drain regions;

forming a first ferroelectric capacitor on said gate with a first conductor of said ferroelectric capacitor coupled to said gate;

forming a wordline conductor on a second conductor of said ferroelectric capacitor; and forming a second capacitor having one conductor electrically coupled to one of said source and drain regions.

60. A method as in claim 59 wherein said ferroelectric capacitor is formed by a first layer of Pt, a layer of ferroelectric material over said first layer of Pt material, and a second layer of Pt material over said layer of ferroelectric material.

61. A method as in claim 60 wherein said first layer of Pt is provided on a layer of polysilicon forming said gate and said wordline conductor is connected to said second layer of Pt.

* * * * *